United States Patent
Reed et al.

(10) Patent No.: US 6,661,830 B1
(45) Date of Patent: Dec. 9, 2003

(54) TUNABLE OPTICALLY-PUMPED SEMICONDUCTOR LASER INCLUDING A POLARIZING RESONATOR MIRROR

(75) Inventors: Murray K. Reed, Palo Alto, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 10/265,958

(22) Filed: Oct. 7, 2002

(51) Int. Cl.$^7$ ............................................... H01S 3/08
(52) U.S. Cl. ........................ 372/99; 372/20; 372/108
(58) Field of Search ........................ 372/99, 20, 107, 372/108

(56) References Cited

U.S. PATENT DOCUMENTS

| | | | |
|---|---|---|---|
| 5,155,622 A | 10/1992 | Kawatsuki et al. | 359/485 |
| 5,255,278 A | 10/1993 | Yamanaka | 372/45 |
| 5,291,502 A * | 3/1994 | Pezeshki et al. | 372/20 |
| 5,572,543 A * | 11/1996 | Heinemann et al. | |
| 5,598,300 A * | 1/1997 | Magnusson et al. | 359/566 |
| 5,694,247 A | 12/1997 | Ophey et al. | 359/566 |
| 5,726,805 A | 3/1998 | Kaushik et al. | 359/589 |
| 5,991,318 A * | 11/1999 | Caprara et al. | 372/22 |
| 6,154,471 A | 11/2000 | Jin et al. | 372/20 |
| 6,191,890 B1 | 2/2001 | Baets et al. | 359/572 |
| 6,285,702 B1 | 9/2001 | Caprara et al. | 372/92 |
| 6,437,925 B1 * | 8/2002 | Nishioka | 359/726 |
| 6,498,685 B1 * | 12/2002 | Johnson | 359/626 |
| 2001/0055733 A1 * | 12/2001 | Irie et al. | 430/396 |
| 2003/0138742 A1 * | 7/2003 | Irie et al. | 430/396 |

FOREIGN PATENT DOCUMENTS

| | | | |
|---|---|---|---|
| JP | 58-174906 | 10/1983 | G02B/5/20 |
| JP | 2-178604 | 7/1990 | G02B/5/18 |

OTHER PUBLICATIONS

João Crisóstomo Weyl Albuquerque Costa and Attílio José Giarola, "Analysis of the Selective Behavior of Multilayer Structures with a Dielectric Grating," *IEEE Transactions on Antennas and Propagation*, vol. 43, No. 5, May 1995, pp. 529–533.

S.S. Wang and R. Magnusson, "Theory and applications of guided–mode resonance filters," *Applied Optics*, vol. 32, No. 14, May 10, 1993, pp. 2606–2613.

S. Barkeshli, T. Smith, H.S. Luh, L. Ersoy and T. Itanami, "On the Analysis and Design of the Frequency Selective Surface for the N–Star Satellite Ku/S–Shaped Reflector," *IEEE Antennas and Propagation Society Internal Symposium Digest*, vol. 3, 1999, pp. 1656–1658.

I. Mashev and E. Popov, "Diffraction Efficiency Anomalies of Multicoated Dielectric Gratings," *Optics Communications*, vol. 51, No. 3, Sep. 1, 1984, pp. 131–136.

* cited by examiner

*Primary Examiner*—Leon Scott, Jr.
(74) *Attorney, Agent, or Firm*—Stallman & Pollock LLP

(57) ABSTRACT

An optically-pumped semiconductor (OPS) laser includes a multilayer structure including a mirror-structure surmounted by a multilayer semiconductor gain-structure. A membrane mirror is spaced apart from the mirror structure to form a laser resonator between the mirror structure and the membrane mirror, with the gain-structure included in the laser resonant cavity. Pump light is transmitted through the membrane mirror into the gain structure. The membrane mirror includes a grating having parameters selected such that the membrane mirror has different reflectivities at the wavelength of the laser in two orthogonally-oriented planes of polarization. The membrane mirror is axially movable along the resonator axis for varying the resonator length to select the wavelength of the single lasing mode.

33 Claims, 24 Drawing Sheets

US 6,661,830 B1

TUNABLE OPTICALLY-PUMPED SEMICONDUCTOR LASER INCLUDING A POLARIZING RESONATOR MIRROR

TECHNICAL FIELD OF THE INVENTION

The present invention relates generally to external-cavity, surface-emitting semiconductor lasers. It relates in particular to an external-cavity, surface-emitting semiconductor laser having a resonator formed between a movable polarization selective cavity-mirror and a polarization selective mirror.

DISCUSSION OF BACKGROUND ART

In optical communications systems, information is transmitted along an optical fiber as a modulated beam of light. In one preferred optical communication arrangement, wavelengths for the light beam are in a range between about 1.513 micrometers ($\mu$m) to about 1.565 $\mu$m, corresponding to a frequency range from about 196,000 gigahertz (GHz) to about 192,000 GHz. In a scheme referred to as dense wavelength-division-multiplexing (DWDM) the frequency range is partitioned into 40 channels at 100 GHz intervals. A trunk optical fiber may carry up to 40 different beams at 40 different wavelengths, one corresponding to each channel. The different-wavelengths (optical-carrier) beams are generated by InGaAsP edge-emitting diode-lasers, one for each channel. The output of each laser is modulated to encode the information to be transmitted onto the laser-beam provided by the laser. Communications channels are separated from or added to the trunk optical fiber by wavelength-selective couplers.

An optical communications system having such close channel spacing would benefit from a laser that could be rapidly and accurately tuned from the wavelength of one channel to the wavelength of another. One suitable laser type for this purpose is an external-cavity, optically-pumped, surface-emitting semiconductor laser (OPS-laser). Such a laser has a resonator (resonant cavity) formed between two mirrors. One of the resonant cavity mirrors is an integral part of a multilayer structure including a semiconductor multilayer, surface-emitting gain-structure. The mirror can be formed from metal, dielectric, or semiconductor layers or combinations thereof. The other resonant cavity mirror is external to and spaced apart from the gain-structure. This mirror is partially transmissive and is used as an output-coupling mirror. The mirror is usually formed from dielectric layers, semiconductor layers or combinations thereof.

The emitting wavelength of the laser depends on the materials of the gain-structure and the optical spacing between the first and second mirrors. The gain-structure provides gain only in a limited range of wavelengths. This range is generally referred to as the gain bandwidth. By way of example, an InGaAsP OPS-laser having a nominal emitting wavelength of about 1.550 $\mu$m has a gain bandwidth of about 0.035 $\mu$m. The second mirror can be made movable for varying the spacing, thereby tuning the laser to vary the emitting wavelength within the gain bandwidth. (See, for example, U.S. Pat. Nos. 5,291,501; 5,572,543 and 6,154,471, incorporated herein by reference.)

A preferred arrangement of such a tunable external-cavity semiconductor laser is one in which the nominal spacing between the mirrors is sufficiently small that the separation between possible resonant wavelengths of the cavity is greater than the gain bandwidth. This is often referred to by practitioners of the art as a short-cavity OPS-laser. The cavity length may be about 30 $\mu$m for a OPS-laser having a nominal emitting wavelength of about 1.550 $\mu$m. The short cavity provides that the laser can emit at only one wavelength within the gain bandwidth for any variation of laser spacing within one half-wavelength of the nominal spacing. Accordingly, no other mode selection device is necessary. Such a laser is also very compact, enabling a number of such lasers to be assembled in a compact array.

In longer cavity lasers, a tilt-tunable etalon, a birefringent filter, or a diffraction grating filter is typically used to limit the number of possible oscillating modes. Such devices also cause the laser to oscillate in a plane-polarized mode. An edge-emitting laser inherently has polarized sensitive gain. Plane-polarized operation is advantageous in optical communications systems that include polarization sensitive devices such as Faraday rotators, and multilayer dielectric mirrors used at non-normal incidence. In a short cavity OPS laser there is insufficient space between the external mirror and the gain-structure to include a tilted etalon or a birefringent filter and the laser oscillates in a minimally defined polarization mode, often with only minimal power difference between two eigen polarizations. A laser without a clearly defined polarization is more susceptible to feedback in the orthogonal polarization. This shortcoming needs to be overcome to improve the potential of the short-cavity, external resonator OPS-laser.

SUMMARY OF THE INVENTION

In one aspect, the present invention is directed to a mirror for reflecting light at a lasing wavelength and transmitting light at an optical pump light wavelength. The optical pump light wavelength is the shorter of the wavelengths. The mirror includes a peripherally supported membrane. The membrane has a grating on an outer surface thereof. The grating includes a regular array of spaced-apart parallel strips of a first material having a first refractive index. The grating surmounts at least one optical interference layer of uniform thickness. The optical interference layer can be a layer of the first material, or a layer of a second material having a second refractive index different from the first refractive index. The grating strips are characterized as having a width and a height, and the grating has a grating period defined as the distance between adjacent ones of the parallel strips. The grating period is less than the pump light wavelength. The first material, any second material, the grating width and height, the ratio between the grating width and period, and the thickness of the at least one and any other uniform-thickness layers are selected such that the second mirror has a different specular reflectivity for light having the lasing wavelength, normally incident in first and second polarization planes oriented respectively parallel and perpendicular to the grating strips, and such that the mirror has a transmissivity greater than 50% for pump-wavelength light polarized in any one of the polarization planes.

The term specular reflectivity (or simply reflectivity) as used herein can be alternatively defined as the zero-order diffraction efficiency, where this term refers to the zero order diffraction efficiency of the grating and any other optical interference layers as a whole. The term "transmissivity" refers to the zero-order or specular transmissivity. Reflectivity, transmissivity and diffraction efficiency are specified herein alternatively as a percentage or a decimal ratio where 1.0 is 100%.

Preferably the specular reflectivity for the lasing wavelength is between about 90% and 99% in one of the polarization planes, and is at least about 1% less in the other polarization plane, and the transmissivity of the mirror for pump-wavelength light is greater than 50% (0.50 in decimal notation) in some polarization orientation.

The at least one optical interference layer may be a layer of the first material, i.e., the material of the grating strips. Alternatively, the at least one optical interference layer is a layer of a material having a refractive index different from that of the grating strips.

In one preferred embodiment of the inventive grating-membrane mirror there is only one interference layer having the same refractive index as that of the grating strips The grating strips and mirror in this embodiment may be considered as a single grating comprising the spaced apart strips and a uniform thickness portion. The specular reflectivity for laser light in either of the polarization orientations is greater than would be provided by the optical interference layer (uniform thickness portion of the grating) in the absence of the grating strips. In another preferred embodiment of the inventive grating membrane mirror a grating including a uniform thickness portion surmounts four other optical interference layers. The first-wavelength specular reflectivity in either of the polarization orientations is less than would be provided by the uniform thickness portion of the grating and the four optical interference layers in the absence of the grating strips. In calculated examples of each embodiment, a lasing wavelength reflectivity of about 98% for wavelengths between about 1.530 and 1.565 $\mu$m is achieved together with greater than 70% transmissivity for 0.980 $\mu$m plane-polarized (TM) pump light. Reflectivity for TE polarized light was less than 45% between about 1.530 and 1.565

In another aspect of the present invention, the above-described grating membrane mirror provides an output-coupling mirror in a tunable OPS-laser. The OPS-laser includes a multilayer structure including a first mirror surmounted by a multilayer semiconductor gain-structure. The gain-structure has a gain-bandwidth including the lasing wavelength, and is energized by pump light having the pump-light wavelength. The inventive grating membrane mirror is peripherally supported by one surface of a semiconductor substrate over an aperture therein and is electrically isolated from the substrate. The mirror is spaced apart from the first mirror to form a laser resonator. The laser resonator has a longitudinal axis and the gain-structure is included in the laser resonator. Pump light is directed into the gain-structure through the grating membrane mirror. The optical spacing between the first mirror and the grating membrane mirror is selected such that the laser resonator supports only a single lasing mode, the wavelength of which is within the gain-bandwidth of the gain-structure.

At least one layer of the grating membrane mirror has an electrically conductive portion and means for making electrical contact with that electrically conductive portion. A electrical contact is provided a surface of the substrate opposite the surface supporting the grating membrane mirror. Applying an electrical potential between the electrically conductive portion of the grating membrane mirror layer and the electric contact on the substrate causes a central portion of the grating membrane mirror to move in a direction parallel to said longitudinal axis of said laser resonant cavity for selecting the wavelength of said lasing mode.

The first material, any second material, the grating width and height, the ratio between the grating width and period, and the thickness of the at least one and any other uniform-thickness layers are selected such that the second mirror has a sufficiently different reflectivity in the polarization planes oriented parallel and perpendicular to the grating strips, for light having the oscillating wave wavelength, that the lasing mode is plane polarized in the plane for which the reflectivity is highest, and such that the grating membrane mirror has a transmissivity greater than about 50% (0.50 in decimal terms) at said pump light wavelength in any polarization plane orientation.

As noted above the central optical telecommunications wavelength range extends from 1.535 $\mu$m to 1.565 $\mu$m. The gain-bandwidth of any particular semiconductor gain structure having a nominal emitting wavelength in this range is about 0.035 $\mu$m. In a telecommunications system there can be a single laser in accordance with the present invention tunable over a gain bandwidth of about 0.035 $\mu$m about the nominal wavelength. In all calculated examples of embodiments of the present invention discussed hereinbelow, a tuning wavelength range between 1.530 and 1.565 $\mu$m is assumed. This is done simply to assist in comparing performance of the various examples and should not be construed as limiting the present invention.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

Figure 1:
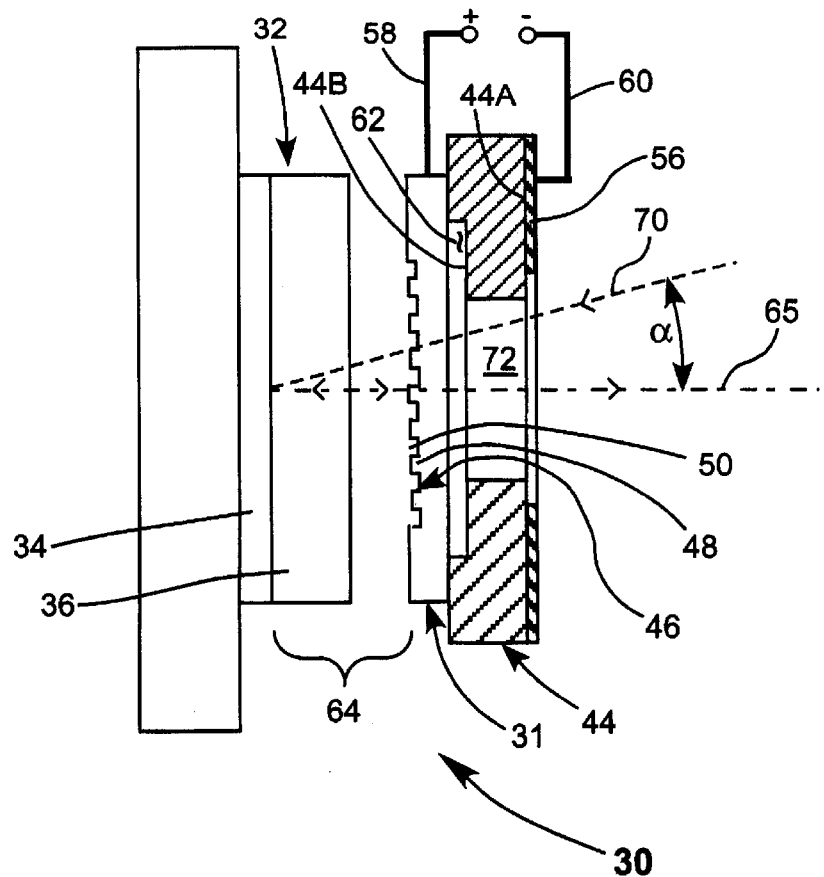
FIG. 1 is an elevation view, partly in cross-section, schematically illustrating one preferred embodiment of a tunable external-cavity OPS-laser including an external cavity mirror in the form of an electrostatically-movable, sub-wavelength-grating membrane mirror in accordance with the present invention, the grating comprising a regular array of spaced-apart, parallel, dielectric strips.

Referring now to the drawings, wherein like features are designated by like reference numerals, FIG. 1 schematically illustrates a preferred embodiment 30 of a tunable, optically pumped, semiconductor (OPS) laser including a grating membrane mirror 31 in accordance with the present invention. Laser 30 includes a multilayer structure (OPS-structure) 32 including a mirror structure 34 and a semiconductor multilayer gain-structure 36. Mirror structure 34 may include dielectric or semiconductor layers only, or one or more dielectric or semiconductor layers in combination with a metal layer. OPS-structure 32 is preferably in thermal contact with a substrate or heat sink 38.

Gain-structure 36 is a surface-emitting gain-structure comprising a plurality of active (optical-gain-providing) layers (not shown) spaced apart by optical-pump-light-absorbing spacer layers (not shown). As OPS-structures are well known in the art to which the present invention pertains, a more detailed description of OPS-structure 32 is not presented herein. (See for example, U.S. Pat. Nos. 5,991,318 and 6,285,702, assigned to the same assignee as herein and incorporated by reference.)

Figure 2:
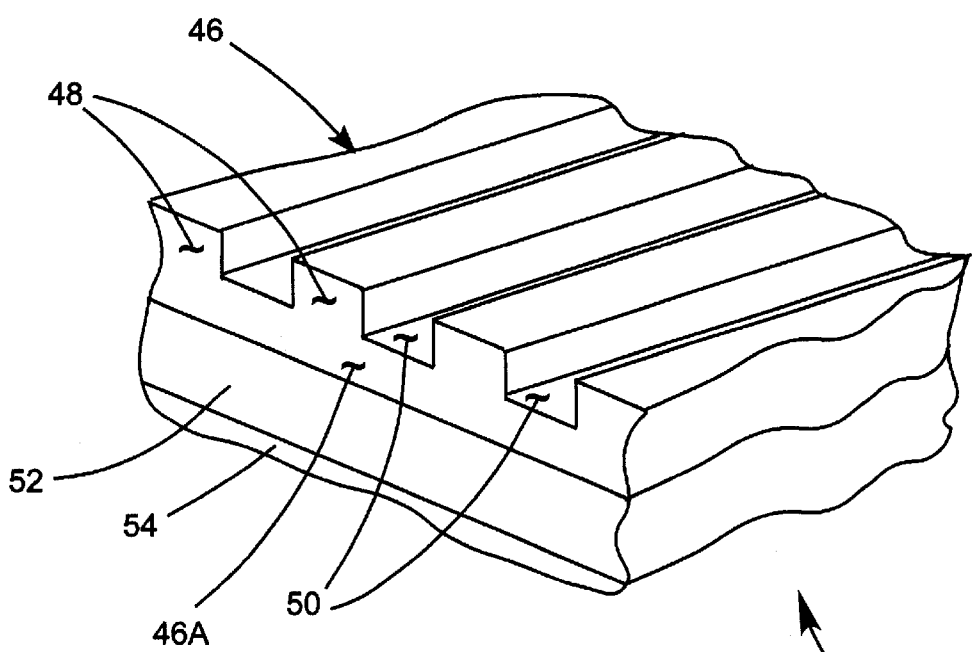
FIG. 2 is a fragmentary three-dimensional view schematically illustrating detail of grating strips and spaces and optional interference layers in the membrane mirror of FIG. 3.

Continuing with reference to FIG. 1 and additionally to FIG. 2, mirror 31 is peripherally supported on a semiconductor substrate 44. Mirror 31 includes a grating portion 46 including a plurality of parallel strips 48 separated by spaces 50. Strips 48, here, have a rectangular cross-section, but this should not be considered as limiting the present invention. Grating 46 optionally includes a uniform-thickness portion 46A of the same material as strips 48. Mirror 31 optionally includes one or more uniform-thickness layers in addition to grating 46. Two such layers 52 and 54 are depicted in FIG. 2. If mirror 31 includes at least one such additional layer, uniform portion 46A of grating 46 may be omitted and strips 48 formed directly on the additional layer. The material of strips 48 uniform thickness portion 46A, and any other layers, may be a dielectric material or a semiconductor material.

Mirror 31 has an electrically conductive portion (not shown) and means for making electrical contact with this electrically conductive portion. Mirror 31 and the electrically conductive portion thereof are electrically isolated from substrate 44. An annular, metal contact-layer 56 is deposited on a surface 44A of substrate 44. A DC potential is established between substrate 44 and mirror 31 via leads 58 and 60. This applied potential provides an electrostatic driving field for moving mirror 31. The magnitude of the field is dependent, inter alia, on the applied potential and the dimension of a gap 62 between surface 44B of substrate 44 and mirror 31.

Mirrors 31 and 34 define a resonator 64 of the laser. For the above-exemplified active-layer material providing gain at wavelengths between about 1.515 µm and 1.565 µm, the optical spacing between the mirrors should be nominally about 30 µm or less. This spacing provides that the laser can lase at only a single oscillation mode of the resonator, along a resonator axis 65. The optical spacing between mirror structure 24 and mirror 42 includes the optical thickness of gain-structure 36. Varying the electrostatic driving potential applied to mirror 31 moves the mirror axially on axis 65, thereby varying the exact spacing between mirrors 31 and 34 and, consequently, the wavelength of the single oscillating mode of laser 30.

Laser 20 is optically pumped by light 70 from a pump laser (not shown). For the above-exemplified active-layer and spacer-layer materials of gain-structure 26, the pump-laser is preferably a diode-laser providing pump-light at a wavelength of either about 0.980 µm or about 1.30 µm. Pump-light 70 is directed, here, at an angle α to resonator axis 65. Substrate 44 has a circular aperture 72 extending therethrough. Pump-light 70 enters laser 30 via aperture 72 in substrate 44, through grating membrane mirror 31, and is absorbed in gain-structure 36. It should be noted here that the above discussed arrangement for directing pump light into laser 30 through mirror 31 is but one of a number of such possible arrangements and should not be construed as limiting the present invention. Other options include passing the pump light through the mirror coaxially along axis 65.

A primary purpose of including grating 46 in the inventive membrane mirror is to provide that the mirror has sufficiently different reflectivity, in polarization planes perpendicular to each other, for normally incident light, that the laser will oscillate (lase) in only that polarization plane in which the reflectivity is the higher. Depending on factors including the gain provided by gain-structure 36 and the power in pump light 70, a reflectivity difference of as little as one percent (1%) between the polarization planes may be sufficient. This reflectivity difference, at least, can be provided in the inventive membrane mirror.

It has also been determined that given certain conditions, a grating of a material having a refractive index greater than about 1.6 can provide a significantly higher reflectivity in at least one plane of polarization than could be achieved in a free-standing layer of the same material having a uniform optical thickness of one-quarter wave or some odd multiple thereof. It has also been determined that the grating can be caused to optically interfere with a number (one or more) of uniform-thickness layers to provide a spectral response of the mirror with spectral features more closely spaced and with wider variation than would be possible were the grating layer replaced by a uniform layer of the same material and depth as the grating strips.

It is believed that the grating surface, considered as a crenellated or corrugated interface between a medium having the refractive index of the above-discussed grating strips 48 and a medium from which light is incident, would not provide, in itself, a zero-order diffraction efficiency higher than the Fresnel reflection for an interface between the same media. It is believed that this is true for any refractive index difference across the corrugated interface for any dimension, spacing or shape of strips and grooves 48 and 50, and for any polarization orientation.

It is believed that in order to achieve the enhanced reflectivity, grating strips and grooves must be formed on a substrate having a substantially different refractive index from that of the grating strips. Alternatively the strips and grooves of the grating may be formed (as depicted in FIG. 2) in a layer having a uniform portion 46A as discussed above, with a medium, layer or substrate of a material having a substantially different refractive index interfacing with the plane face of the layer (in the example of FIG. 2, this is layer 52).

Figure 3:
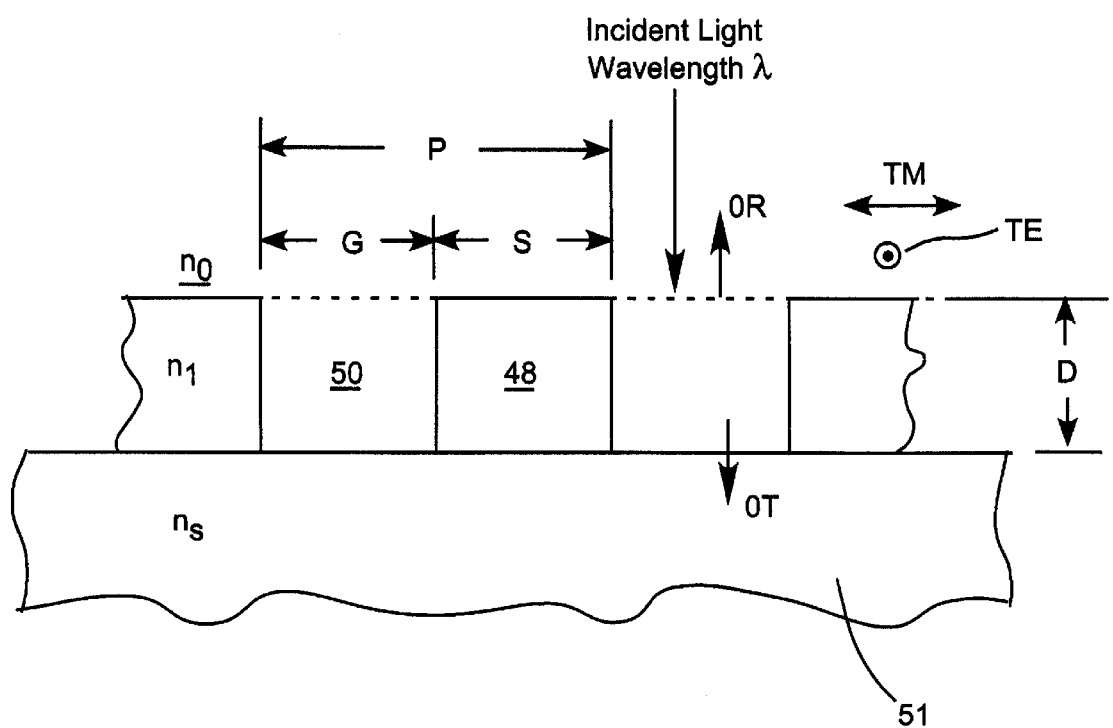
FIG. 3 is a cross-section view schematically illustrating important dimensions, values, interfaces and polarization orientations in a grating similar to the grating of FIG. 2 but supported on a substrate.

Continuing now with a more detailed description of above conditions and constraints for the configuration of grating 46, FIG. 3 depicts a grating layer 46 in optical contact with a substrate 51. Grating 46, here, comprises grating strips 48 in direct optical contact with a substrate 51. Light is incident on the grating at normal incidence from a lossless medium having a refractive index no, which in examples discussed below is 1.0, i.e., the refractive index of air or vacuum. Substrate 51 is assumed to be of effectively infinite extent as far as optical interference is concerned, i.e., any incident light passing through the grating into the substrate is not reflected back. Grating strips 48 have a refractive index $n_1$, here, greater than $n_0$. The substrate has a refractive index $n_s$. If value of $n_s$ were 1.0, grating 46 would consist effectively of a parallel array of strips suspended in air. If value of $n_s$ were equal to $n_1$, grating 46 would consist effectively of a crenellated or corrugated interface between a medium having a refractive index $n_s$ and a medium having a refractive index $n_0$, i.e., there would be no other interface to provide optical interference.

Important dimensions of the grating are the depth of spaces (height of strips) D, the grating period P, the strip width S and the spacing or groove width G, and a ratio S:P referred to hereinafter as the duty cycle (DC) of the grating. D is referred to hereinafter as the grating depth. In all examples and embodiments discussed herein, it is important that grating period P is less than the shortest wavelength to be reflected or transmitted by the grating. The grating may be referred to as a sub-wavelength grating for this reason. Providing that P is less than one wavelength is important in providing that light is reflectively diffracted or transmitted in only the zero-order.

It is assumed in all examples and embodiments discussed herein that DC is 0.50. This should not be considered as limiting the present invention. Varying DC can be expected to vary spectral properties of a grating membrane mirror in accordance with the present invention. Varying DC is particularly effective in varying polarization separation if variation of other parameters is constrained by other design requirements.

Important values in the grating are the zero-order diffraction efficiency 0R (specular reflectivity) and the zero-order transmissivity 0T (specular transmissivity). Value 0R is specified herein at a hypothetical plane coincident with the top of grating strips 48. Transmissivity 0T is specified herein as a value immediately below the substrate surface and will be absorbed or transmitted by the substrate depending on the absorption coefficient of the substrate. The values of 0R and 0T will be discussed with reference to light polarized with its electric field vector either parallel (TE polarization) or perpendicular (TM polarization) to grating strips and spaces 48 and 50.

Figure 4A:
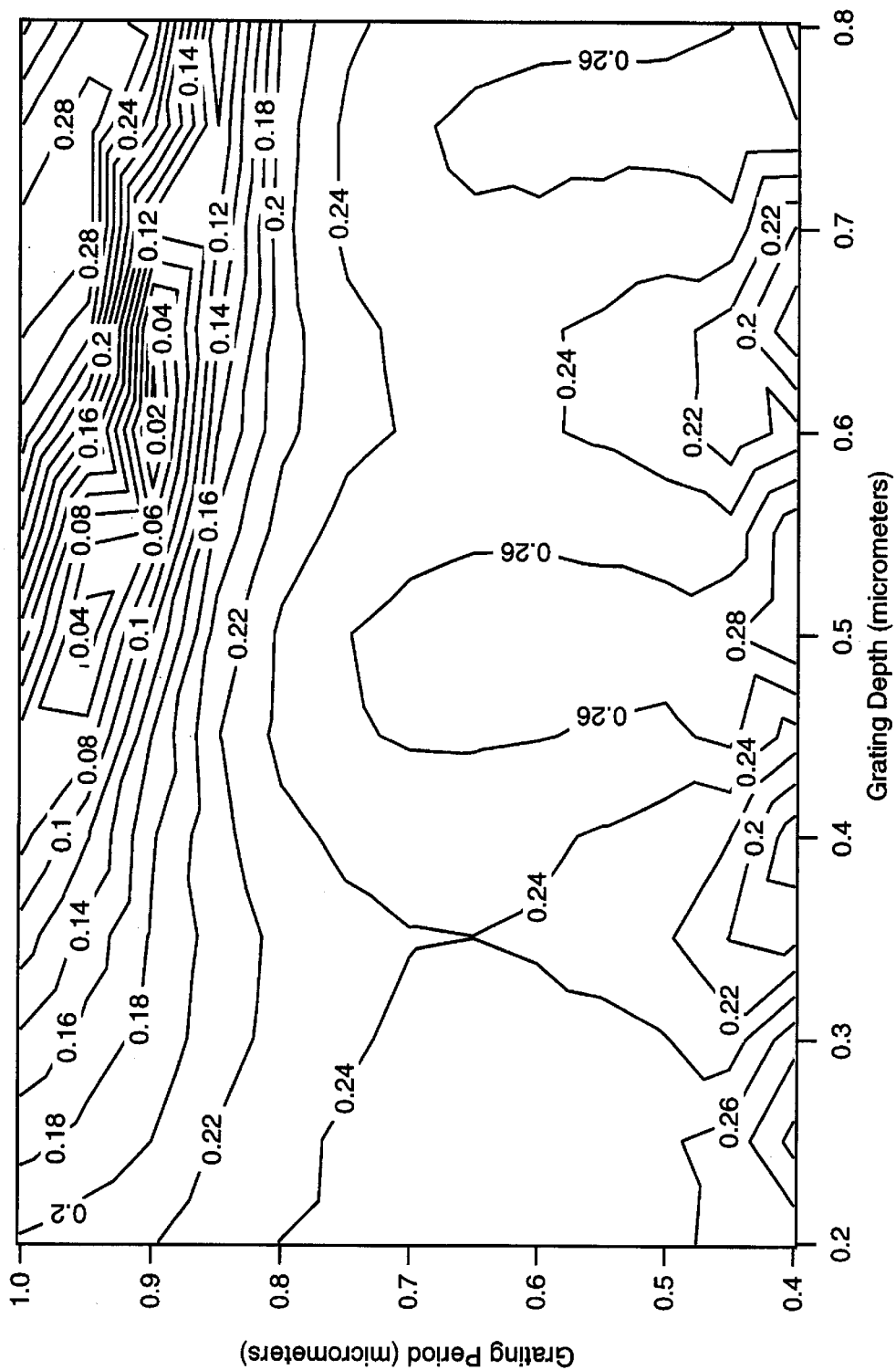
FIGS. 4A and 4B are contour graphs schematically illustrating calculated variation of zero-order reflected diffraction efficiency with grating depth and grating period for normally incident light in respectively TE and TM orientations in the grating of FIG. 3 having strips of refractive index of about 3.5 on a substrate having the same refractive index, with the light incident on the grating from air.
Figure 4B:
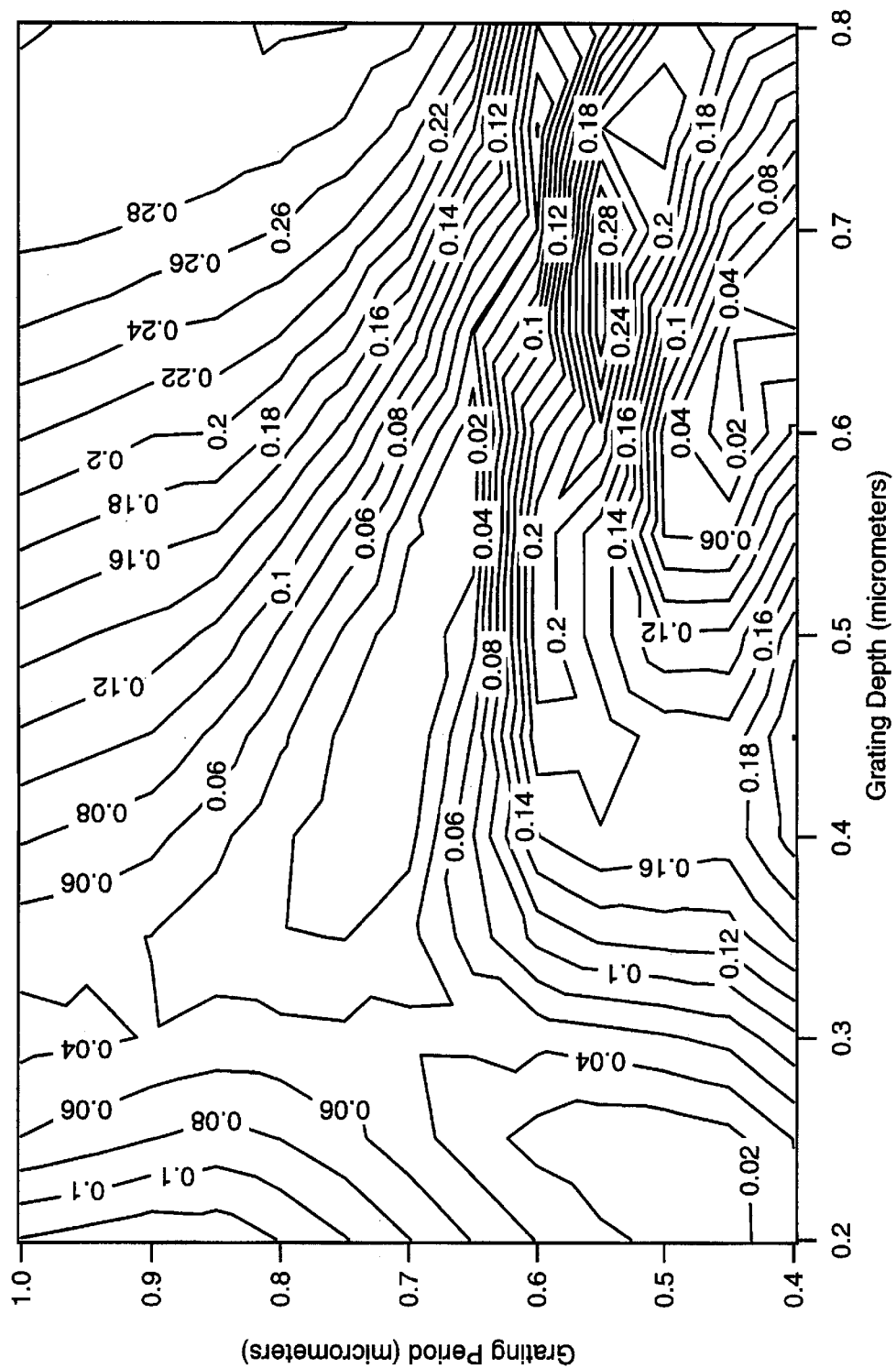

FIGS. 4A and 4B are contour graphs schematically illustrating calculated variation of zero-order reflected diffraction efficiency 0R as a function of grating depth D and grating period P for normally incident light having a wavelength of 1.550 µm, in respectively TE and TM orientations. In this and similar contour graphs discussed hereinbelow, the contours are contours of equal zero-order diffraction efficiency (specular reflectivity) and are labeled with the appropriate value. In this example, grating strips 48 are assumed to have a refractive index $n_1$ of about 3.5. The refractive index $n_s$ of substrate 74 is assumed to be identical with $n_1$. Accordingly, grating 46, here, is simply a corrugated interface between a medium having a refractive index of 3.5 and a medium having a refractive index of 1.0. Incident light passes through the grating but is not reflected back from any interface below the grating.

In the TE orientation (FIG. 4A), 0R has a relatively small variation over a parameter space bounded by P between about 0.5 and 0.8, and D between about 0.2 and 0.8. In the TM orientation (FIG. 4B) 0R is generally relatively low (less than 0.2) over most of the parameter space of FIG. 4B. The maximum value of 0R in any polarization orientation is about 0.306. This is about the same value as the Fresnel reflectivity of an interface between a medium having a refractive index 1.0 and a medium having a refractive index of 3.5. In the example FIGS. 4A and B there is no enhancement of reflection by the grating. There is, however, a difference between 0R in the TE and TM polarizations over most of the parameter the space.

Figure 5A:
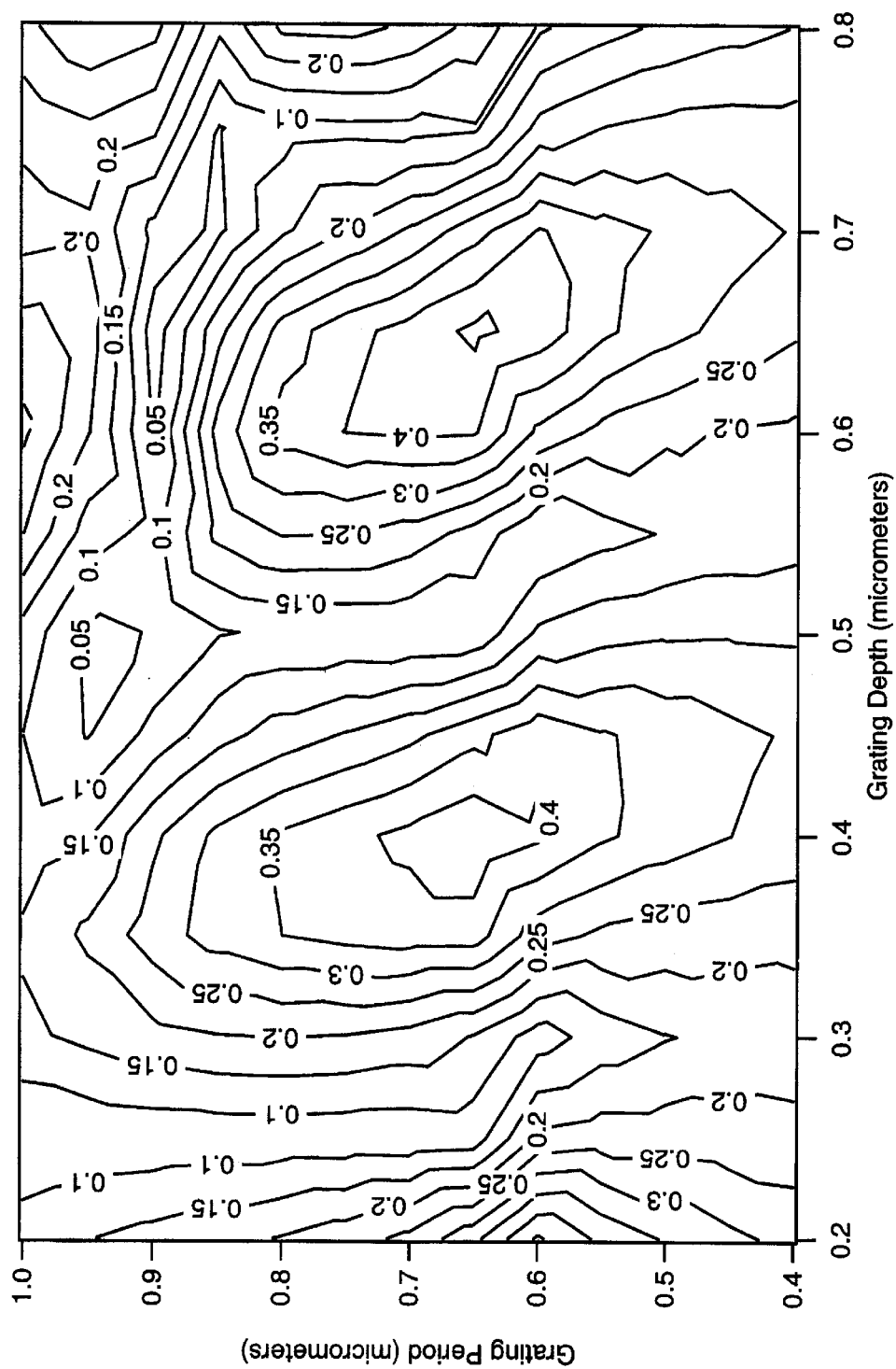
FIGS. 5A and 5B are contour graphs schematically illustrating calculated variation of zero-order reflected diffraction efficiency with grating depth and grating period for normally incident light in respectively TE and TM orientations in the grating of FIG. 3 having strips of refractive index of about 3.5 on a substrate having a refractive index of 2.5, with the light incident on the grating from air.
Figure 5B:
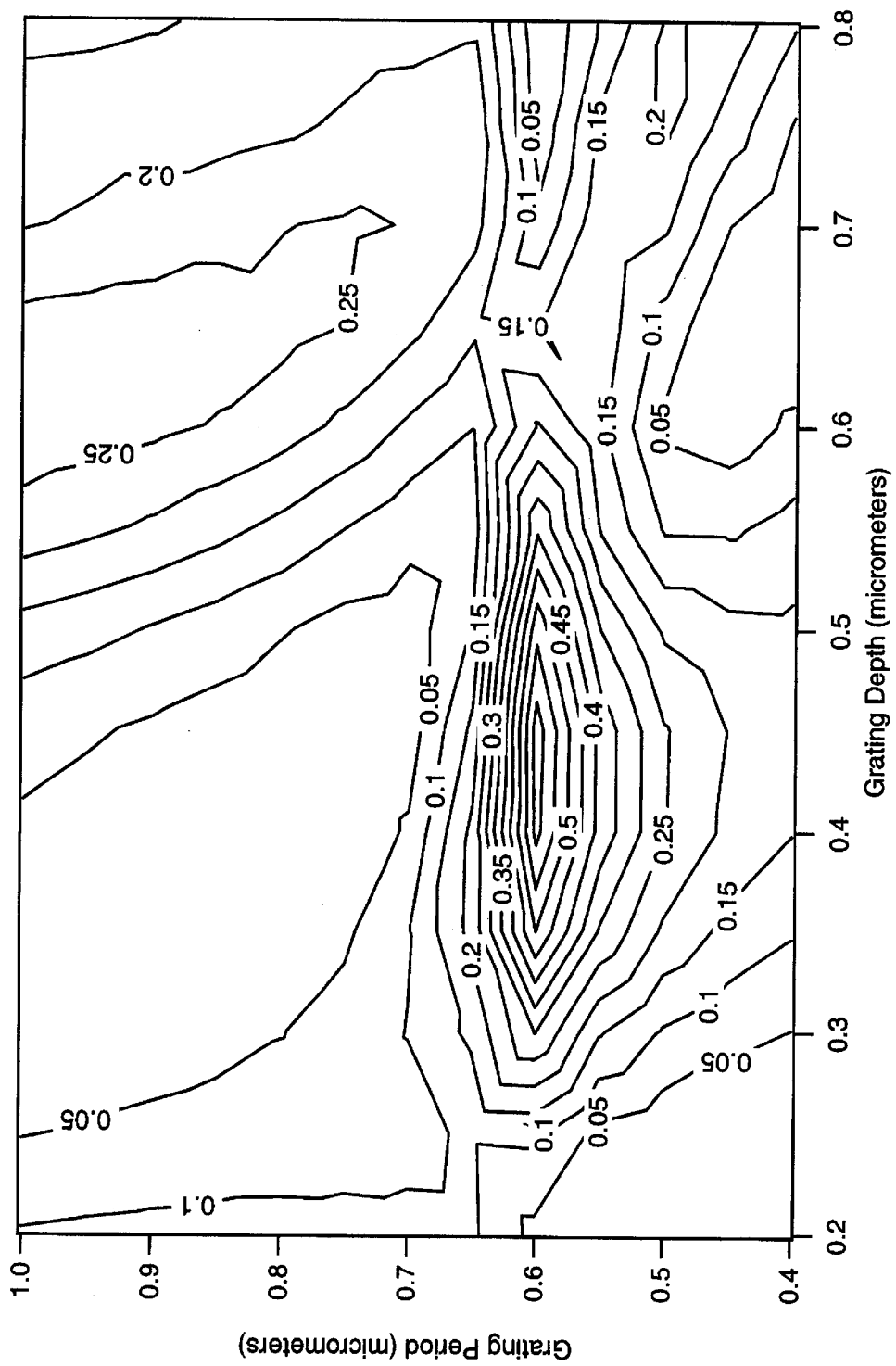

FIGS. 5A and 5B are contour graphs schematically illustrating calculated variation of zero-order reflected diffraction efficiency 0R as a function of grating depth D and grating period P for normally incident light having a wavelength of 1.550 µm, in respectively TE and TM orientations. Here, grating strips 48 are assumed to have a refractive index $n_1$ of about 3.5. The refractive index $n_s$ of substrate 51 is assumed to be 2.5. Incident light passes through the grating, and a portion of that light not reflected by the grating is reflected from the interface between the grating and the substrate.

The maximum value of 0R in any polarization orientation is about 0.625. This value occurs for TM polarization, and is higher than the Fresnel reflectivity of an interface between a medium having a refractive index 1.0 and a medium having a refractive index of 3.5, and higher than the reflectivity of a quarter-wave thick layer having a refractive index 3.5. The maximum reflectivity for TE polarization is about 0.461. This is higher than the Fresnel reflectivity of an interface between a medium having a refractive index 1.0 and a medium having a refractive index of 3.5, but lower than the reflectivity of a quarter-wave thick layer having a refractive index 3.5 (about 0.51). An air suspended uniform-thickness layer having a quarter-wave optical thickness of any material provides the highest reflectivity that can be obtained at normal incidence in a single uniform thickness layer of that material. In the example FIGS. 5A and 5B the grating can be considered as enhancing reflection for TM polarized light only.

Figure 6A:
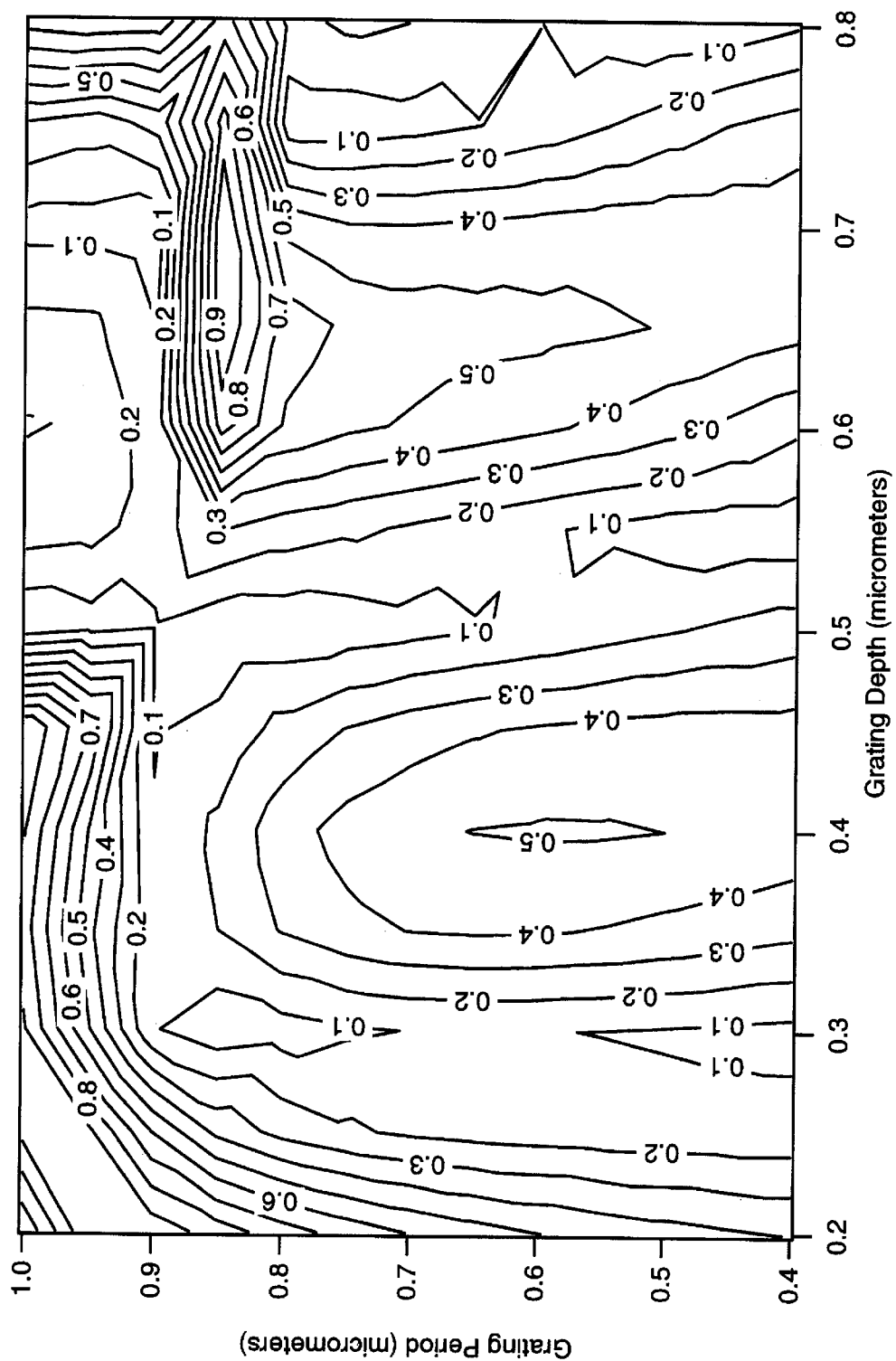
FIGS. 6A and 6B are contour graphs schematically illustrating calculated variation of zero-order reflected diffraction efficiency with grating depth and grating period for normally incident light in respectively TE and TM orientations in the grating of FIG. 3 having strips of refractive index of about 1.5 on a substrate having a refractive index of 2.5, with the light incident on the grating from air.
Figure 6B:
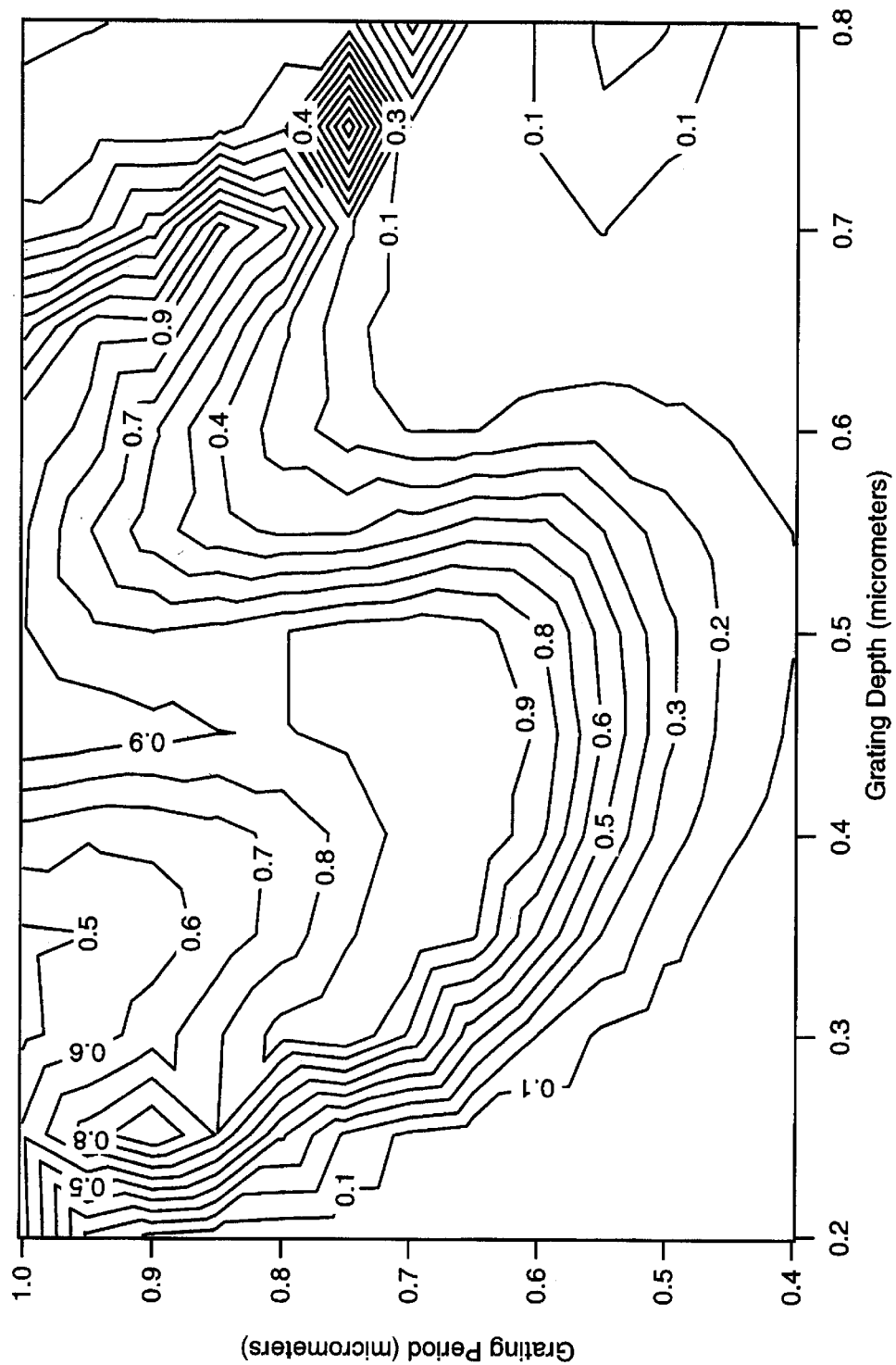

FIGS. 6A and 6B are contour graphs schematically illustrating calculated variation of zero-order reflected diffraction efficiency 0R as a function of grating depth D and grating period P for normally incident light having a wavelength of 1.550 µm, in respectively TE and TM orientations. Here, grating strips 48 are assumed to have a refractive index $n_s$ of about 3.5. The refractive index $n_s$ of substrate 74 is assumed to be 1.5. Again, incident light passes through the grating, and a portion of that light not reflected by the grating is reflected from the interface between the grating and the substrate. The reflectivity from the substrate-grating interface is higher in this example than in the example of FIGS. 5A and 5B. The maximum value of 0R in both polarization orientations is greater than 0.99. In the example FIGS. 6A and 6B the grating can be considered as substantially enhancing reflection for both TE and TM polarized light. From FIG. 6B it can be seen that substantial enhancement of reflectivity for TM polarization can be achieved in wide area of the total parameter space.

Figure 7A:
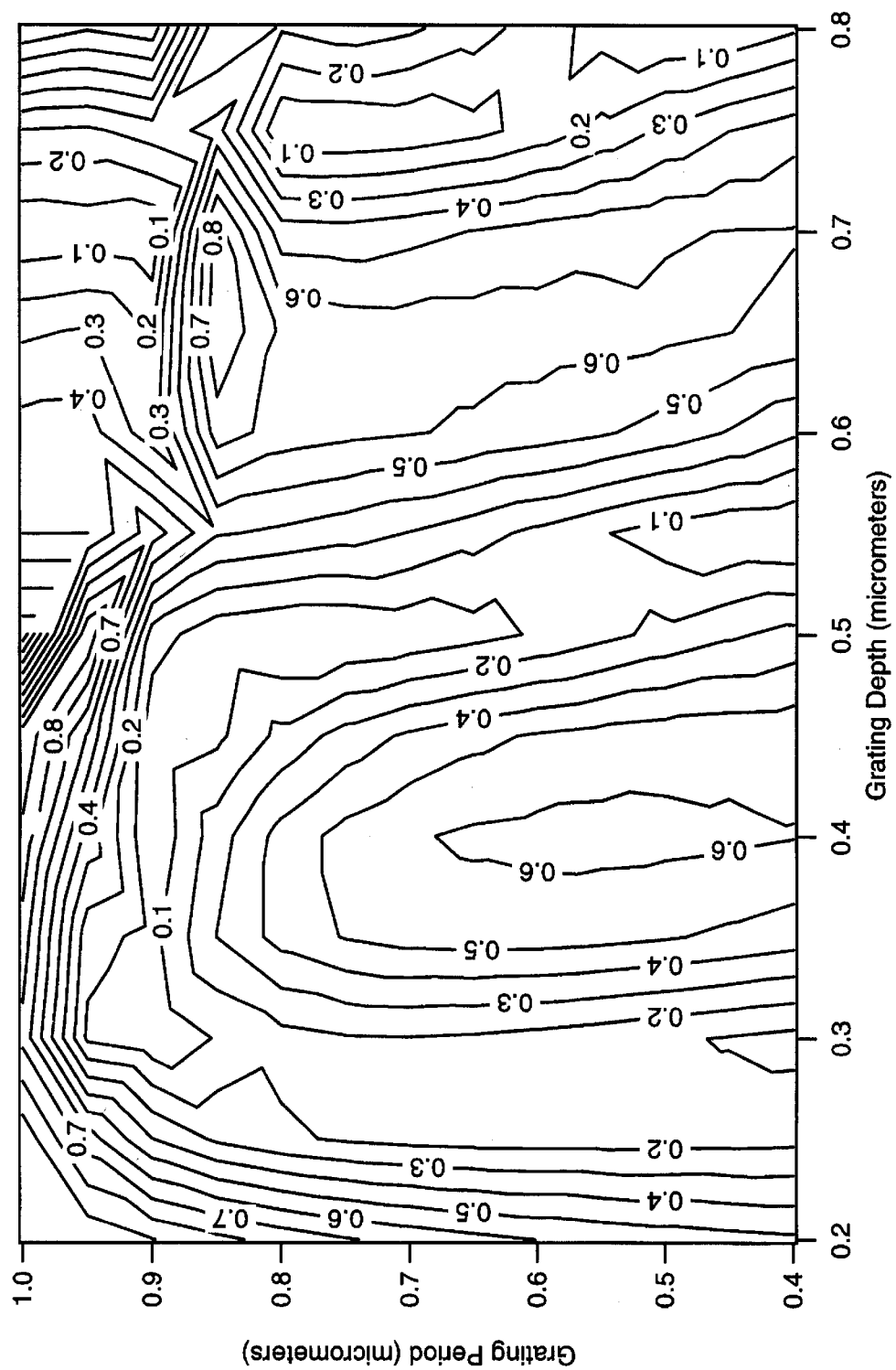
FIGS. 7A and 7B are contour graphs schematically illustrating calculated variation of zero-order reflected diffraction efficiency with grating depth and grating period for normally incident light in respectively TE and TM orientations for the grating of FIG. 3 having strips of refractive index of about 3.5, with the light incident on the grating from air and with the grating suspended in air, i.e., having air as a substrate.
Figure 7B:
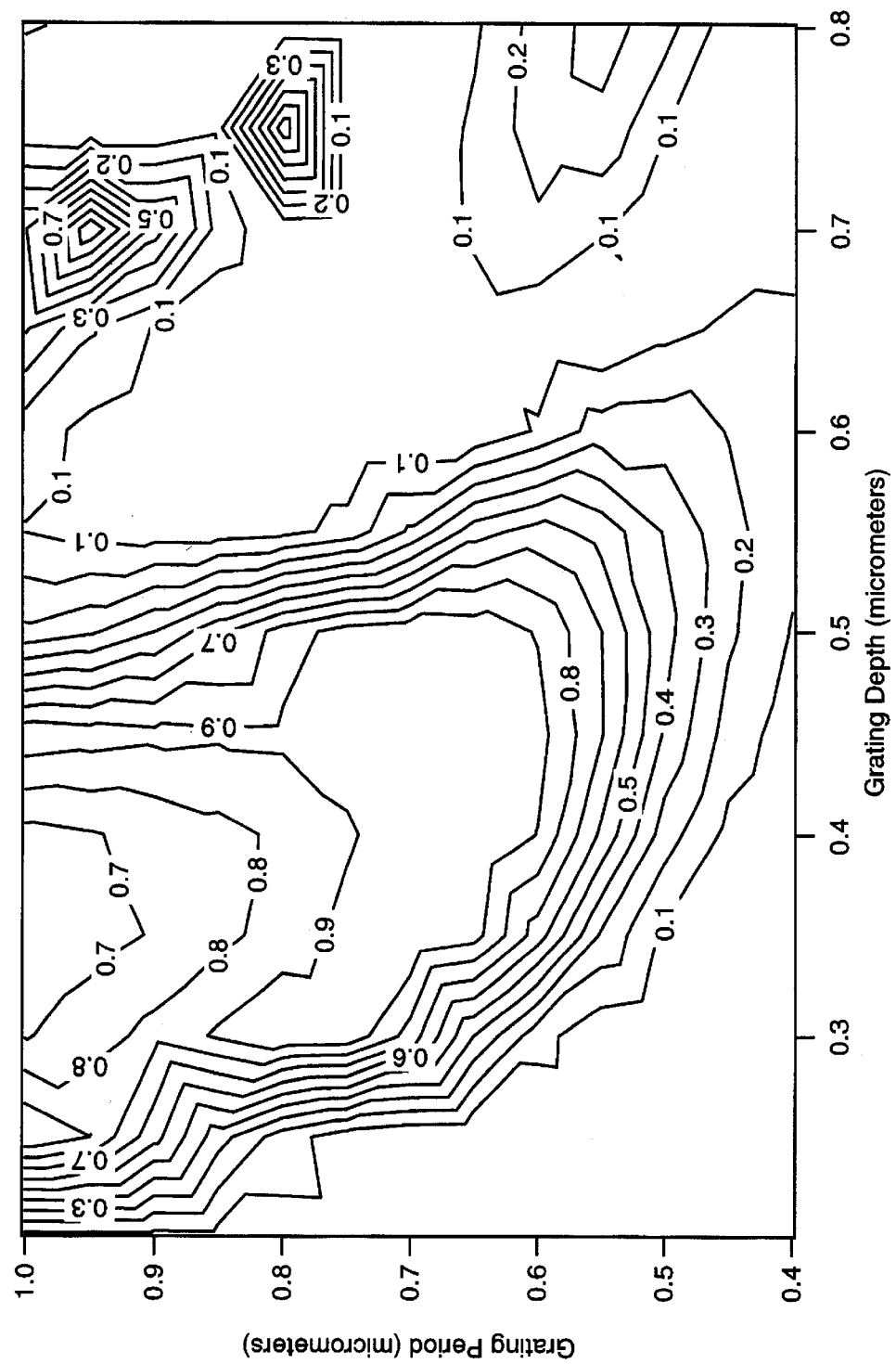

FIGS. 7A and 7B are contour graphs schematically illustrating calculated variation of zero-order reflected diffraction efficiency 0R as a function of grating depth D and grating period P for normally incident light having a wavelength of 1.550 µm, in respectively TE and TM orientations. Here, grating strips 48 are assumed to have a refractive index $n_1$ of about 3.5. The refractive index $n_s$ of substrate 74 is assumed to be 1.0. This represents the grating strips as simply being suspended in a plane array, in air, an arrangement that may be difficult to achieve in practice.

The maximum value of 0R occurs for TM polarization, and is in excess of 0.9998. In the example FIGS. 7A and 7B the grating can be considered as substantially enhancing reflection for both TE and TM polarized light. It can be seen from FIG. 7B that substantial enhancement of reflectivity for TM polarization can be achieved in wide area of the total parameter space.

Figure 8:
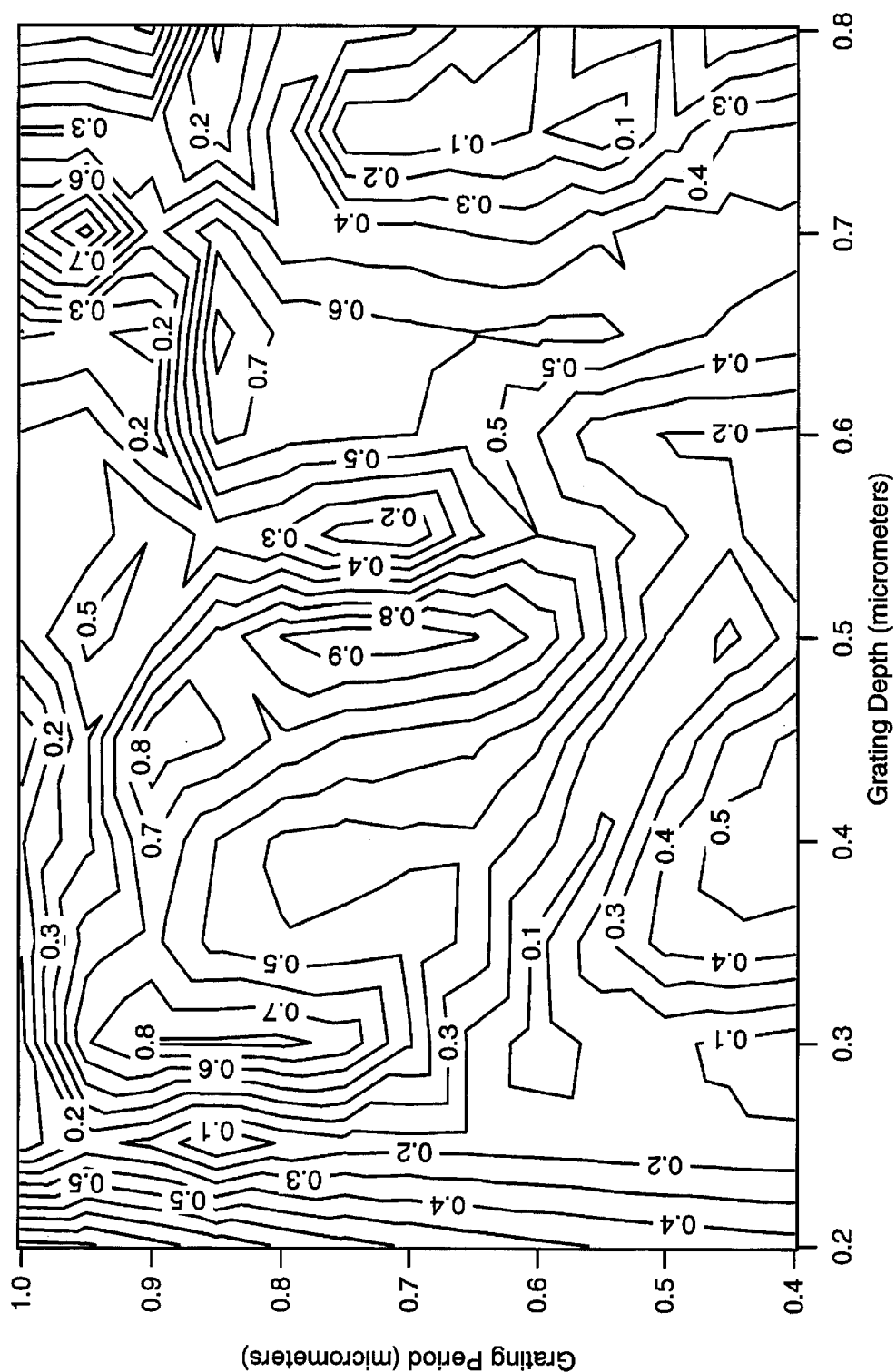
FIG. 8 is a contour graph schematically illustrating calculated variation of the absolute value of the difference in zero-order reflected diffraction efficiency between TE and TM polarizations with grating depth and grating period in the grating of FIGS. 7A and 7B.

FIG. 8 is a contour graph schematically illustrating variation of the absolute value of the difference in zero-order reflected diffraction efficiency between TE and TM polarizations with grating depth and grating period in the grating of FIGS. 7A and 7B. It can be seen this difference exceeds 0.9 only in relatively small areas in the total parameter space. The largest of these areas occurs around a grating period of about 0.7 µm and a grating depth of about 0.5 micrometers.

Figure 9:
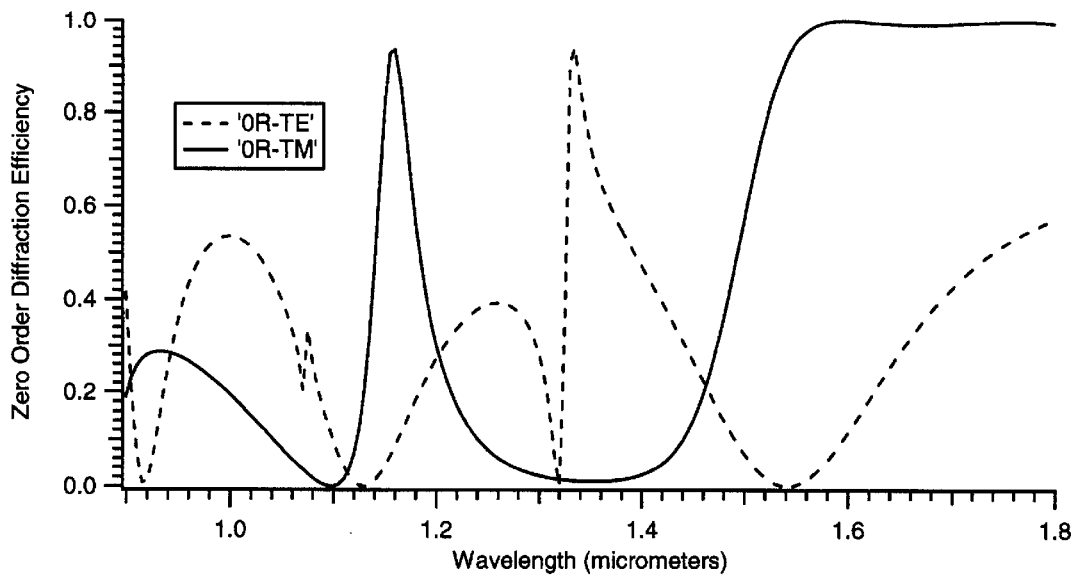
FIG. 9 is a graph schematically illustrating reflected diffraction efficiency as a function of wavelength for TE and TM polarizations for one pair of grating depth and grating period parameters in the grating of FIGS. 7A and 7B.

At this point in the discussion, analysis has concentrated on determining optimum arrangements for providing grating-enhanced reflectivity and polarization separation at one wavelength, here 1.550 µm. As a mirror in accordance with the present invention is required to transmit pump light at 0.980 µm or 1.30 µm, it is important to examine the grating effects at a range of wavelengths including these pump-light wavelengths. A discussion of the wavelength (spectral) response of one configuration of the hypothetical "air-suspended" grating of FIGS. 7A and 7B is set forth below FIG. 9 is a graph schematically illustrates reflected zero-order diffraction efficiency as a function of wavelength for TE and TM polarizations for a grating depth D of 0.5 µm and a grating period of 0.75 µm in the grating of FIGS. 7A and 7B. These grating parameters are selected to provide maximum difference in polarization at a wavelength of 1.550 µm. There is a broad, spectrally flat reflection response for TM polarization (solid curve) at wavelengths longer than 1.550 µm. Diffraction efficiency in this region varies between about 0.98 and 0.99. This is a useful value range for mirror 31 of FIG. 1. Unfortunately, most of this range falls outside a desired tuning range of between 1.530 and 1.565 µm. There is a broad reflection minimum between about 1.28 µm and 1.38 µm. This would allow adequate transmission at normal incidence for 1.30-µm TM-polarized pump light. Transmission at 0.980 µm in either polarization plane is less than optimum.

Figure 10:
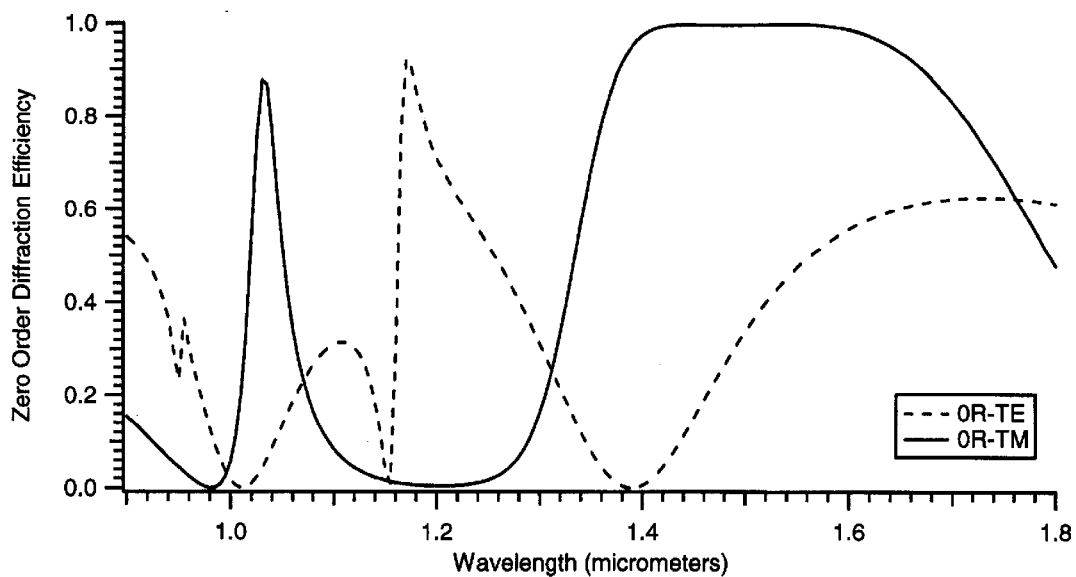
FIG. 10 is a graph schematically illustrating reflected diffraction efficiency as a function of wavelength for TE and TM polarizations for another pair of grating depth and grating period parameters in the grating of FIGS. 7A and 7B.

FIG. 10 is a graph schematically illustrating reflected diffraction efficiency as a function of wavelength for TE and TM polarizations for a grating depth D of 0.45 micrometers and a grating period P of 0.65 micrometers in the grating of FIGS. 7A and 7B. These grating parameters are selected to provide maximum reflectivity around a wavelength of 1.550 µm, regardless of polarization separation. The broad, spectrally flat reflection response for TM polarization (solid curve) is centered about 1.550 µm. Diffraction efficiency in the 1.530 µm to 1.565 µm region varies between about 0.998 and 0.999. This is higher than would be optimum for mirror 31 of FIG. 1 in most cases. Reflection at 1.30 µm in both polarization planes is sufficiently high that transmission would be less than adequate. Reflection at 0.980 µm in either polarization orientation is sufficient to provide adequate transmission.

Figure 11:
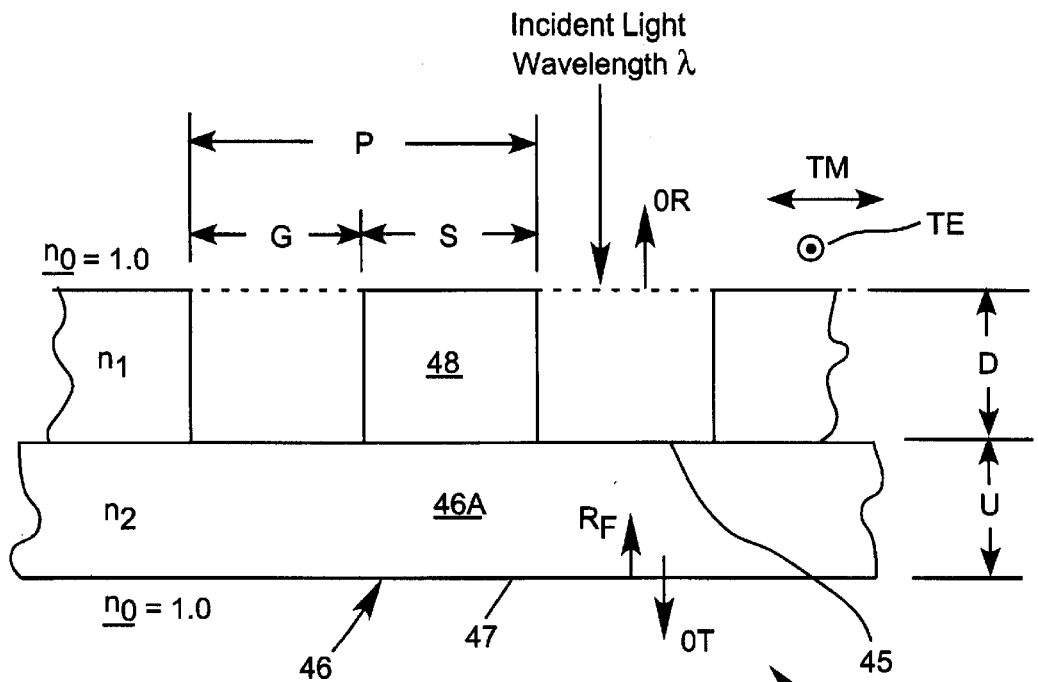
FIG. 11 schematically illustrates one embodiment of a grating, membrane mirror in accordance with the present invention including grating strips of a first material on an interference-thickness membrane-portion of a second material.

FIG. 11 schematically illustrates an embodiment 31A of a grating membrane mirror in accordance with the present invention, wherein the grating 46 comprises grating strips 48 supported on a surface 45 of a membrane portion 46A. Grating parameters are specified as discussed above with reference to FIG. 3. Membrane portion 46A has a uniform thickness U. Zero-order reflection diffraction efficiency is specified at a plane coincident with the top of grating strips 48. Zero-order transmissivity is specified at surface 47 of membrane portion 46A.

It is assumed, here, that grating membrane 46 is suspended in air. As such, the refractive index $n_0$ on both sides of the membrane grating is assumed to be 1.0. Grating strips 48 have refractive index $n_1$, which, in all examples discussed below, is assumed to be the refractive index of polysilicon. This is about 3.502 at a wavelength of 1.550 µm. The refractive index $n_2$ of membrane portion 46A is assumed to be less than the refractive index of the grating strips, but, of course, is greater than that of air. Accordingly, a portion of light passing through membrane portion 46A and incident on surface 47 thereof will be reflected from the surface as indicated by arrow $R_F$. The magnitude of the reflection will be determined by the Fresnel reflection at surface. This, of course, will be higher, the higher the value of refractive index $n_2$.

It is important that the thickness U of the membrane portion is sufficiently uniform that reflected light $R_F$ can optically interfere with light at the grating strips. This provides that the thickness U of grating portion 46A can be adjusted to vary spectral properties of grating 46 as a whole.

The thickness uniformity requirements for providing optical interference are well known to those skilled in the art to which the present invention pertains. Such uniformity is readily achievable in practice by forming membrane portion 46A by a layer deposition process such as sputtering, physical vapor deposition (PVD), chemical vapor deposition (CVD), or the like. A detailed description of fabrication of grating membrane mirrors in accordance with the present invention is presented further hereinbelow.

Figure 12:
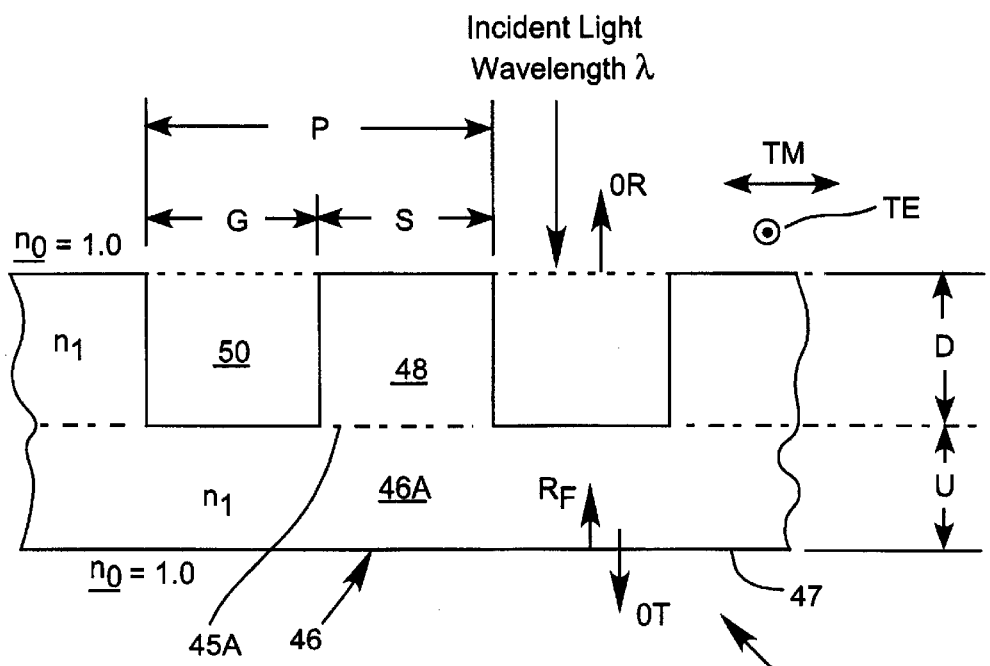
FIG. 12 schematically illustrates another embodiment of a membrane, grating mirror in accordance with the present invention including grating strips of a first material on an interference-thickness membrane-portion of the same material.

FIG. 12 schematically illustrates another embodiment 31B of a grating membrane mirror in accordance with the present invention. This embodiment is similar to the grating membrane mirror of FIG. 11 with an exception that uniform thickness portion 46A of grating 46 is formed of the same material as that of grating strips 48. Accordingly the uniform thickness portion has no upper surface in the mechanical sense. Thickness U of portion 46A, here, is measured between lower surface 47 and a virtual plane 45A coincident with the base of grating strips 48.

Figure 13:
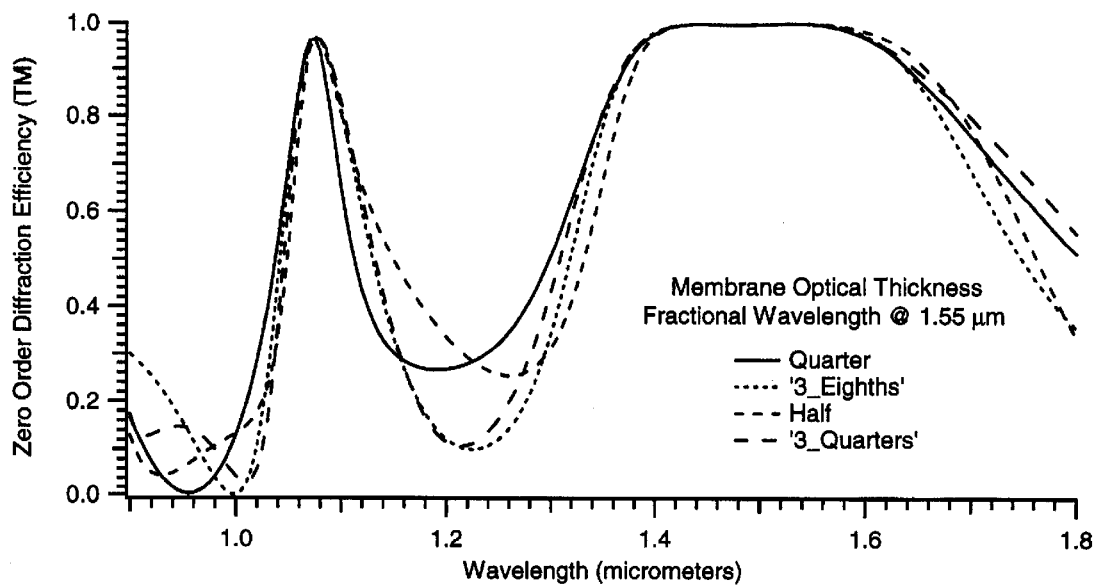
FIG. 13 is a graph schematically illustrating calculated zero-order diffraction efficiency for TM polarization as a function of wavelength and thickness of the membrane portion of a grating, membrane mirror in accordance with the present invention, in the configuration of FIG. 11.

FIG. 13 is a graph schematically illustrating calculated zero-order diffraction efficiency OR for TM polarization as a function of wavelength and thickness of the membrane portion of an example of the grating, membrane mirror of FIG. 11, wherein grating strips 48 are assumed to be fabricated from polysilicon and membrane portion 46A is assumed to be fabricated from CVD deposited silicon dioxide ($SiO_2$) having a refractive index of about 1.42 at a wavelength of about 1.550 µm. Grating depth D is 0.45 µm and grating period P is 0.65 µm. Diffraction Efficiency as a function of wavelength has the same general form, regardless of whether uniform thickness or membrane portion 46A of the mirror has a thickness of one-quarter, three eighths, one-half, or three-quarters of wavelength at a wavelength of 1.550 µm. The value of the diffraction efficiency at 1.550 µm for any of the exemplified thicknesses U is greater than 0.998, which, as noted above, is higher than optimum for a mirror in accordance with the present invention. Although not shown in FIG. 11, it has been determined that calculated zero-order diffraction efficiency for TM polarization as a function of wavelength is also insignificantly affected by variation in U.

Figure 14:
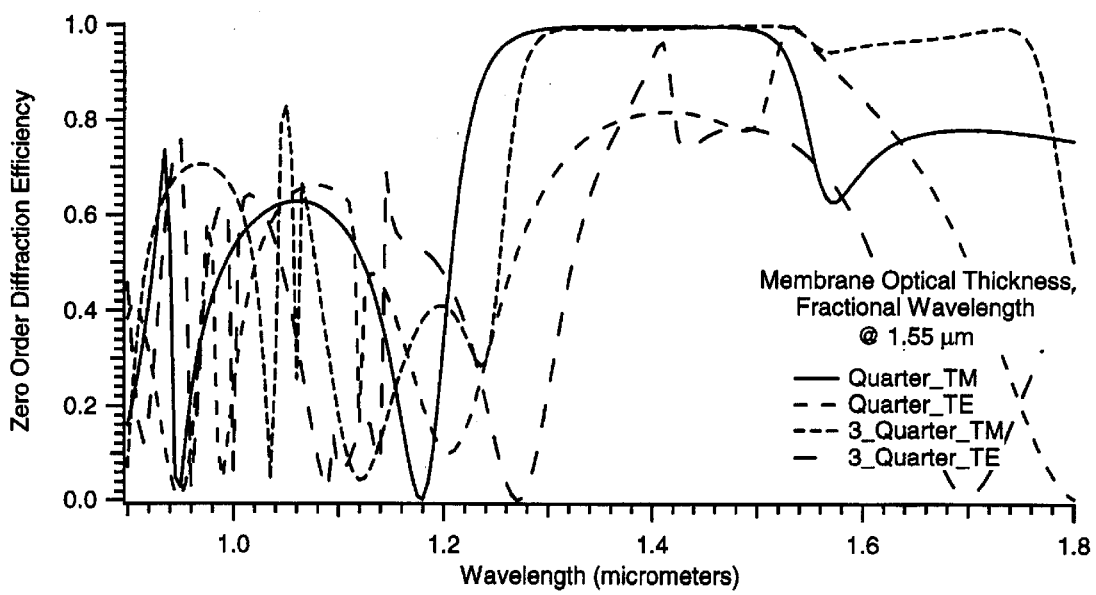
FIG. 14 is a graph schematically illustrating calculated zero-order diffraction efficiency for TE and TM polarization as a function of wavelength and thickness of the membrane portion of a grating membrane mirror in accordance with the present invention, in the configuration of FIG. 12.

FIG. 14 is a graph schematically illustrating calculated zero-order diffraction efficiency OR for TE and TM polarization as a function of wavelength and thickness of the membrane portion of a grating membrane mirror in accordance with the present invention, in the configuration of FIG. 12. Grating depth D is 0.45 µm and grating period P is 0.65 µm. Refractive index $n_1$ is assumed to have a value of about 3.5 at a wavelength of about 1.550 µm. Here, there are significant variations in OR as a function of wavelength for both TE and TM polarization.

Comparing FIG. 14 and FIG. 10, for example, it can be seen that the broad high diffraction efficiency (reflection) band centered around a wavelength 1.550 µm in FIG. 10 (where U is zero) is shifted significantly to shorter wavelengths when U is selected such that membrane portion 46A has an optical thickness of one-quarter wavelength at 1.550 µm. The solid curve of FIG. 14 indicates that this band is shifted such that it is centered around a wavelength of about 1.38 µm. The 1.550 µm wavelength is outside of the high diffraction efficiency region. Increasing the optical thickness of the membrane portion of the grating to three-quarters of a wavelength at a wavelength of 1.550 µm causes a reduction of diffraction efficiency in the broad, high diffraction efficiency region.

This sensitivity of the grating configuration of FIG. 12, not only to variations in grating period P, but to the optical thickness of the membrane portion indicates that some combination of these variables may provide in a membrane grating formed from only one material a mirror that has a reflectivity less than between about 0.97 and 0.99 at 1.550 µm (or some other lasing wavelength) and a high transmission (about 75 percent or greater) at some other wavelength for allowing transmission of pump light through the mirror. As noted above, one suitable reflectivity value for mirror 31 in the laser of FIG. 1 is about 0.98 over a range of wavelengths from about 1.530 μm to about 1.550 μm. Pump light may have a wavelength of 0.980 μm or about 1.30 μm.

In one set of design calculations for such a mirror, a grating, membrane mirror in the configuration of FIG. 12 was assumed to be made of polysilicon having a refractive index of about 3.5 at a wavelength of about 1.550 μm. Grating depth D and grating period P were initially set at 0.45 and 0.65 respectively. Membrane optical thickness U was initially set at 0.66 μm, about three half-wavelengths optical thickness at a wavelength of about 1.550 μm. The particular membrane thickness was selected among other reasons as that which would provide mechanical integrity in the membrane. The calculated diffraction efficiency for TM polarization as a function of wavelength showed a broad, shallow modulated, high diffraction efficiency region extending from a wavelength of about 1.40 μm to a wavelength of about 1.62 μm. A portion of this range had the desired diffraction efficiency 0R about 0.98 near the mid point of the range. Next, a contour plot was calculated having D and P as parameters to determine adjustments necessary to center the 0.98 diffraction efficiency band over the 1.55-μm wavelength. This involved adjusting D from 0.45 to 0.46. Following this adjustment, a contour plot having U and P as parameters was calculated to determine an adjustment to thickness U that would provide a minimum diffraction efficiency (maximum transmissivity) at a wavelength of 0.980 μm. U was adjusted from 0.66 μm to 0.675 nm. This maximized the 0.980 μm transmission and set the diffraction efficiency around 1.550 μm to about 0.982.

Figure 15:
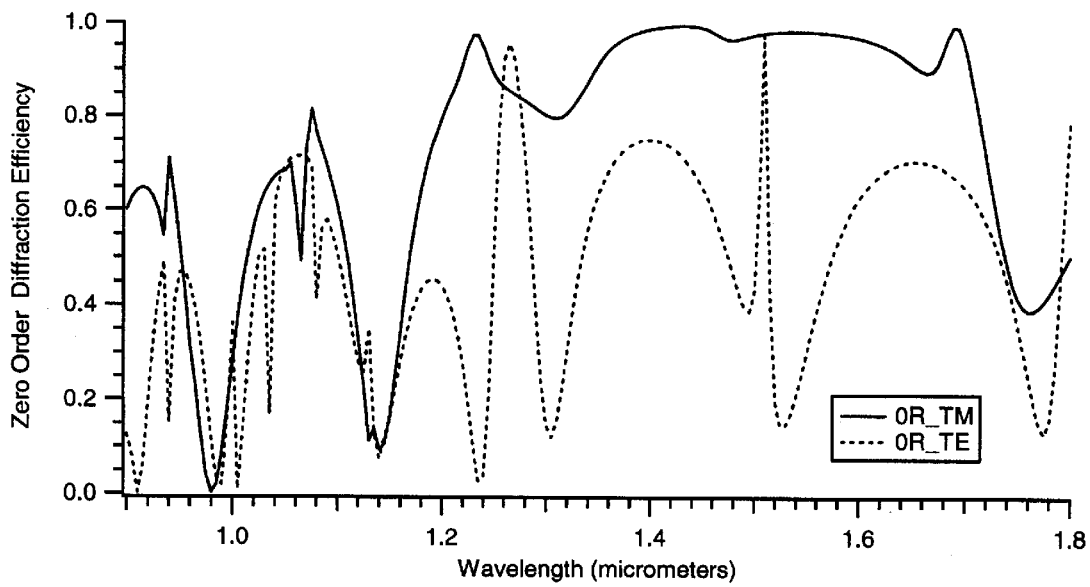
FIG. 15 is a graph schematically illustrating calculated zero-order diffraction efficiency for TE and TM polarization as a function of wavelength of a grating, membrane mirror in accordance with the present invention, in the configuration of FIG. 12, with grating parameters and membrane portion thickness selected to provide zero-order reflection diffraction efficiency for TM polarization of about 0.98 between wavelengths of 1.530 and 1.565 $\mu$m and zero-order transmissivity greater than 0.80 at a wavelength of about 0.98 $\mu$m.
Figure 16:
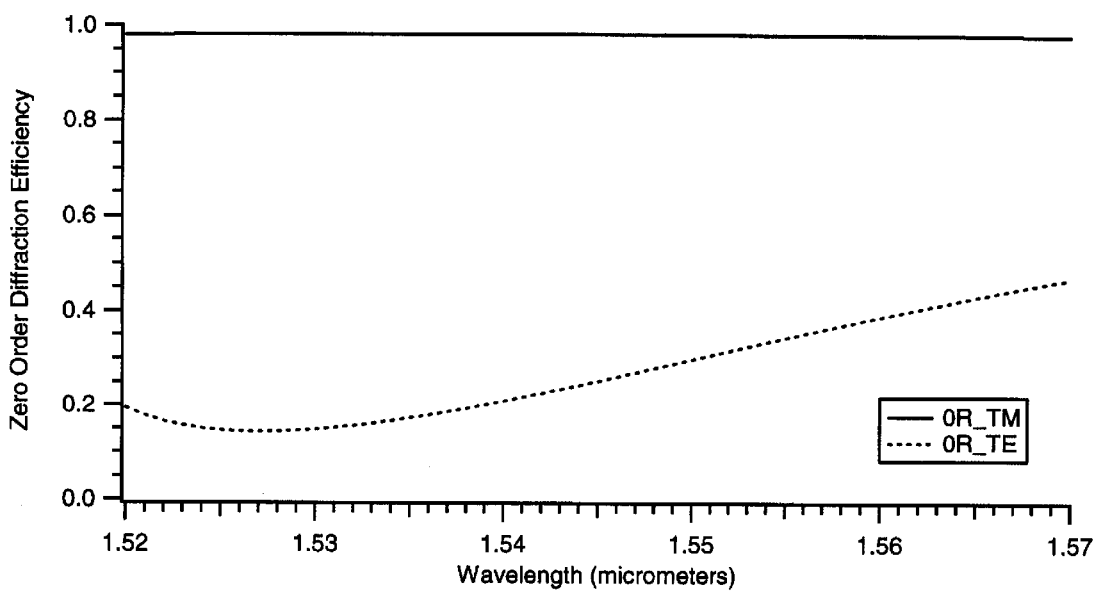
FIG. 16 is a graph schematically illustrating detail of calculated zero-order reflection diffraction efficiency for TE and TM polarization as a function of wavelength between wavelengths of 1.52 and 1.57 $\mu$m in the grating membrane mirror of FIG. 15.

FIG. 15 is a graph schematically illustrating calculated zero-order diffraction efficiency for TE and TM polarization as a function of wavelength for the grating membrane mirror having the adjusted D, P and U parameters in a wavelength range between 0.9 μm and 1.8 μm. The low TM diffraction efficiency at 0.980 μm is clearly visible. FIG. 16 is a graph schematically illustrating detail of calculated zero-order reflection diffraction efficiency for TE polarization (dotted curve) and TM polarization (solid curve) as a function of wavelength between wavelengths of 1.52 and 1.57 μm of the grating, membrane mirror of FIG. 15. This shows excellent polarization separation throughout the range and a minimal variation of the TM diffraction efficiency over the desired tuning range of 1.53 μm and 1.565 μm.

Figure 17:
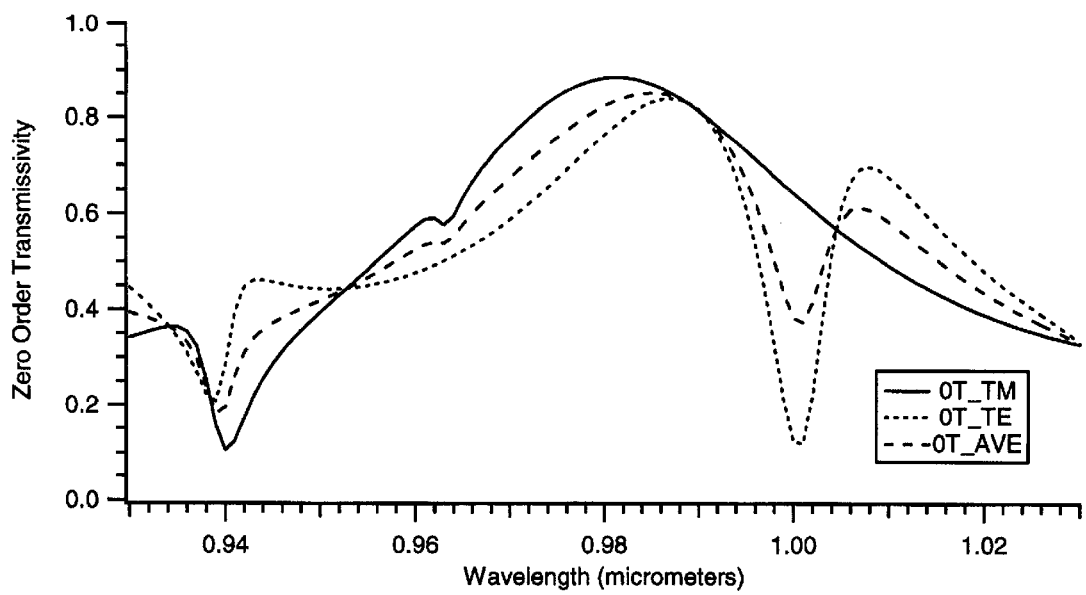
FIG. 17 is a graph schematically illustrating detail of calculated zero-order transmission efficiency for TE, TM, and average polarization as a function of wavelength between wavelengths of 0.94 and 1.02 $\mu$m in the grating membrane mirror of FIG. 15.

FIG. 17 is a graph schematically illustrating detail of calculated zero-order transmission efficiency for TE, TM, and average polarization as a function of wavelength between wavelengths of 0.94 and 1.02 μm in the grating, membrane mirror of FIG. 15. Here, although the grating has been configured for peak TM polarization transmission at pump-light wavelength of 0.980 μm at normal incidence, transmission for TE polarization is comparable. This would allow the use of unpolarized light as pump light. This is advantageous inasmuch as light from the diode-laser arrays typically used to provide such light is typically delivered along an optical fiber, and is unpolarized.

Figure 18:
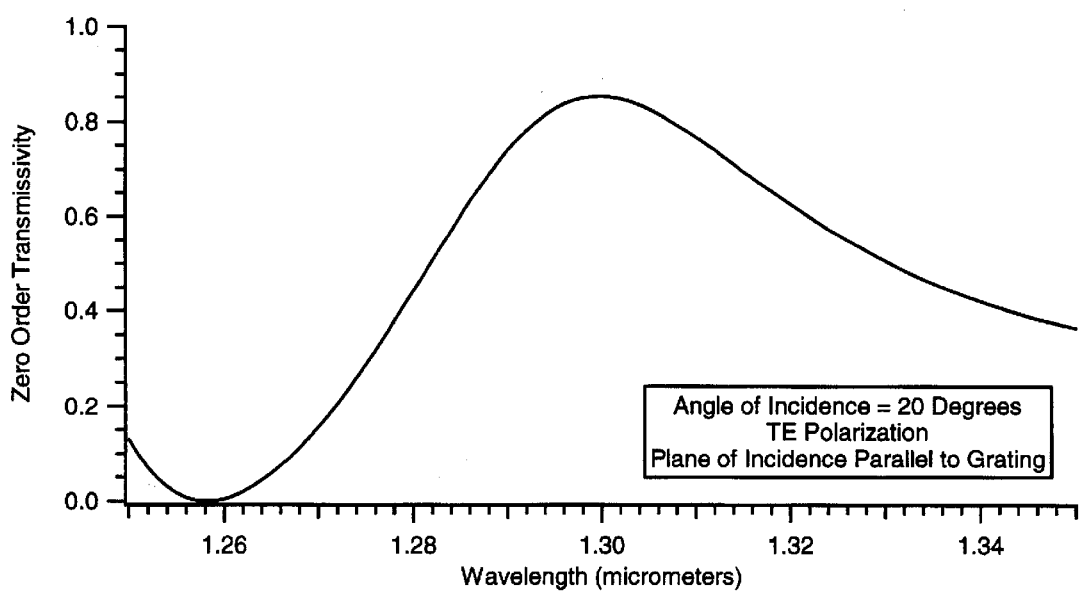
FIG. 18 is a graph schematically illustrating detail of calculated zero-order transmission efficiency for TE "P" polarization at 20 degrees light incidence as a function of wavelength between wavelengths of 1.26 and 1.34 $\mu$m in the grating, membrane mirror of FIG. 15.

FIG. 18 is a graph schematically illustrating detail of calculated zero-order transmission efficiency for TE "P" polarization at 20 degrees light incidence as a function of wavelength between wavelengths of 1.26 and 1.34 μm in the grating, membrane mirror of FIG. 15. At this angle of incidence transmissivity for 1.30 μm pump light is peaked at greater than 0.84.

It should be noted, here, that in a conventional multilayer dielectric mirror used at non-normal incidence, and accordingly polarization sensitive, polarization orientation could be specified only with respect to the plane of incidence. Polarization orientation is conventionally designated "P" or "S" depending on whether the electric field vector is respectively parallel of perpendicular to the plane of incidence. In a grating membrane mirror in accordance with the present invention, there are "P" and "S" orientations for conditions where the plane of incidence is parallel or perpendicular to the grating strips, and the spectral response of the mirror in either orientation may be different.

Figure 19:
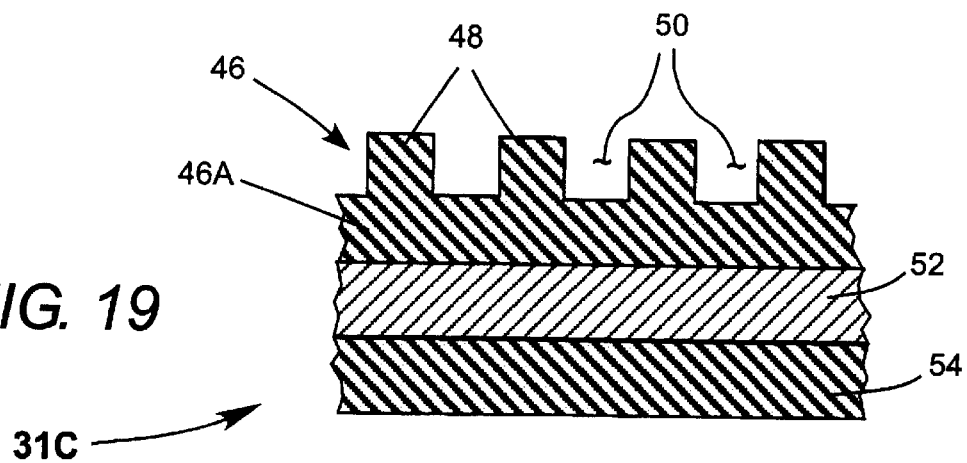
FIG. 19 is a cross-section view schematically illustrating yet another embodiment of a grating membrane mirror in accordance with the present invention including two uniform-thickness layers and a grating layer including a uniform-thickness portion.

FIG. 19 schematically illustrates an embodiment of the inventive grating membrane mirror 31C including two uniform-thickness optical interference layers 52 and 54 and a grating 46 including a uniform-thickness (optical interference) portion 46A and grating strips 48 spaced apart by grooves 50. Grating 46, as discussed above, is preferably made from a high refractive index material such as polysilicon. Layer 52 has a lower refractive index than that of grating 46. Layer 54 is preferably made from the same material as grating 46.

In one preferred method of forming grating 46, sufficient material is deposited to form a uniform-thickness layer having a thickness equal to the sum of the desired thickness of portion 46A and the desired depth or height of grating strips 48. A mask including slit-like apertures having the desired width of the grating strips is then lithographically formed on the layer. The layer and the mask are reactively ion-etched until grooves 50 and strips 48 having the desired depth are provided, thereby forming grating 46. Anything that remains of the mask is chemically removed from the layer to leave the finished grating. Layers 48 may also be formed by depositing only sufficient material to form a layer having the desired thickness of uniform thickness portion 46A of the grating; lithographically forming mask including slit-like apertures having the desired width of the grating strips; depositing sufficient material on the mask and into the slits to form grating strips 48; then chemically removing the mask and any material thereon to leave grating strips 48 on uniform thickness portion 46A of the finished grating.

Figure 20:
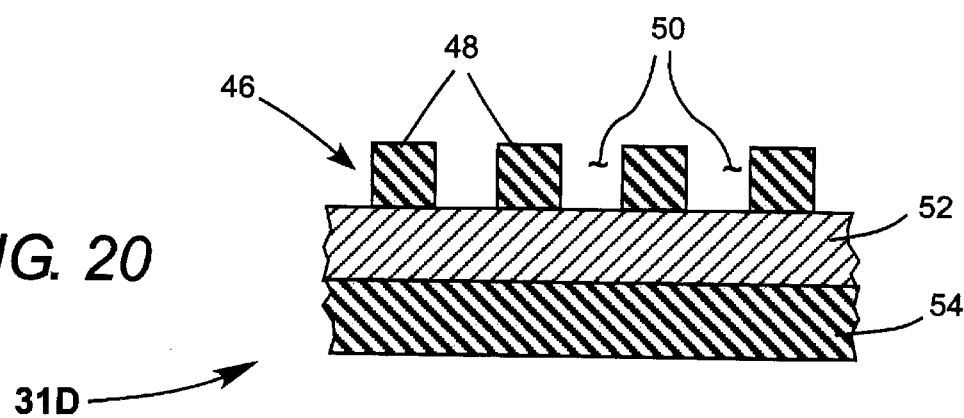
FIG. 20 is a cross-section view schematically illustrating still another embodiment of a grating membrane mirror in accordance with the present invention including two uniform-thickness layers and with grating strips formed on one of the uniform-thickness layers and having a refractive index different from that of the uniform-thickness layer on which it is formed.

FIG. 20 schematically illustrates another embodiment 31D of the inventive grating membrane mirror 31 including two uniform-thickness optical interference layers 52 and 54 and a grating 46 including only grating strips 48 spaced apart by grooves 50. Grating strips 48, as discussed above, are preferably made from a high refractive index material such as polysilicon. Layer 52 has a lower refractive index than that of the grating strips. Layer 54 is preferably made from the same material as the grating strips.

The use of multiple optical interference layers in combination with the grating is particularly useful in cases where the inventive grating membrane mirror is required to have specific reflection or transmission properties at two or more different wavelengths but is not required to have a high degree of polarization separation at any one of the wavelengths. If a high reflectivity, for example about 0.95 or greater, is desired at one wavelength, most practical combinations of layers in mirrors 31C and 31D will not provide such a reflectivity value through optical interference alone, particularly if the layers are configured to provide another value of reflectivity or transmission at another wavelength. The grating will be required to enhance the reflectivity of the layers to provide the desired high reflectivity value. The multiple uniform thickness layers will, reduce the amount of enhancement necessary compared with above-discussed single layer gratings wherein the grating is primarily responsible for providing a high reflectivity. This will allow more flexibility in the choice of grating parameters, which, in turn can provide that the grating parameters may also be selected to contribute to providing desired optical properties at other wavelengths.

It is emphasized that a grating membrane mirror in accordance with the present invention is intended for use a resonator mirror in a laser, and that the primary objective of the grating portion of the mirror is to provide sufficiently different zero-order diffraction efficiency (specular reflection) at a lasing wavelength for TE and TM polarizations that the laser will only lase in that polarization that has the higher reflectivity. As noted above, this reflectivity difference may be as little as about 1.0% (0.01 in decimal notation). Because of this it is possible to consider embodiments of the inventive grating mirror including multiple optical interference layers in which the grating does not provide any reflection enhancement, and may even contribute to reducing reflectivity provided by the multiple interference layers.

Figure 21:
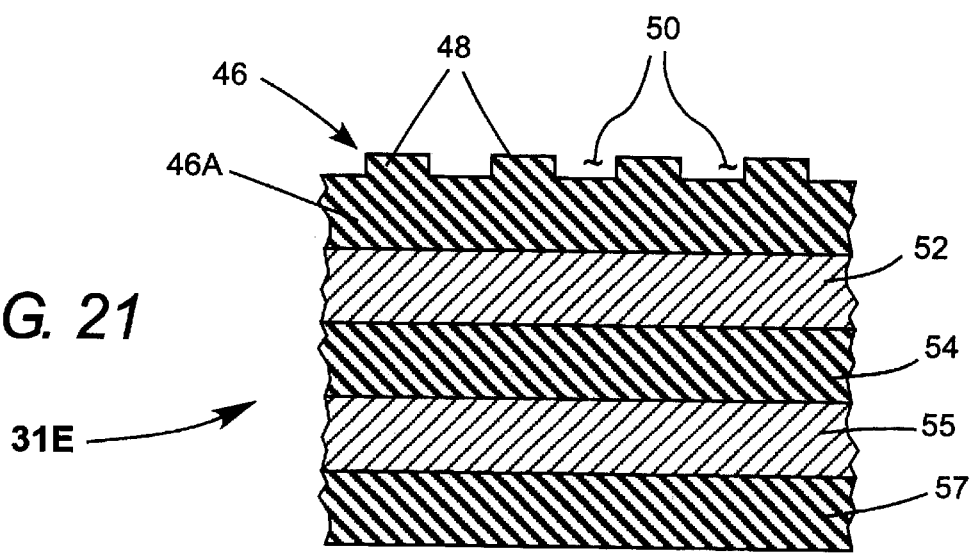
FIG. 21 is a cross-section view schematically illustrating a further embodiment of a grating membrane mirror in accordance with the present invention including four uniform-thickness layers and a grating layer including a uniform-thickness portion.

FIG. 21 is a cross-section view schematically illustrating an embodiment 31E of a grating membrane mirror in accordance with the present invention including four uniform-thickness dielectric layers 52, 54, 55, and 57 and a grating layer 46 including a uniform-thickness portion 46A. Grating 46 and layers 54 and 57 are formed from a relatively high refractive index material such as polysilicon. Layers 52 and 55 have a lower refractive index than that of layers 54 and 57 and preferably include a material such as silicon dioxide ($SiO_2$).

Figure 22:
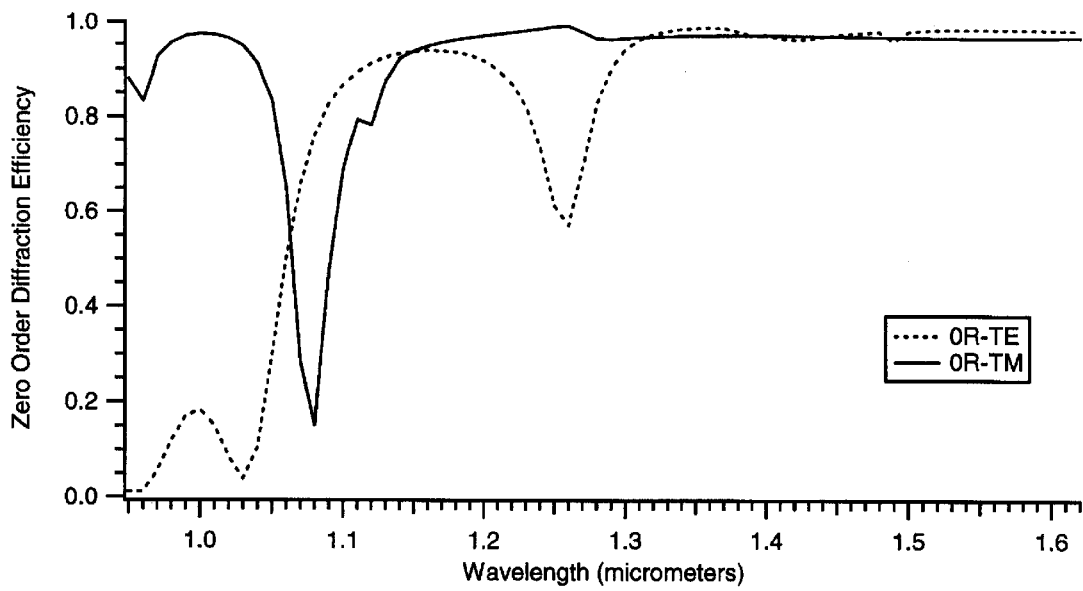
FIG. 22 is a graph schematically illustrating calculated zero-order diffraction efficiency for TE and TM polarization as a function of wavelength in one example of the grating membrane mirror of FIG. 21 arranged to provide zero-order diffraction efficiency of about 0.98 at wavelengths between about 1.53 and 1.565 $\mu$m and transmissivity greater than 0.70 for light having a wavelength of about 0.980 $\mu$m and at 20.0 degrees incidence.
Figure 23:
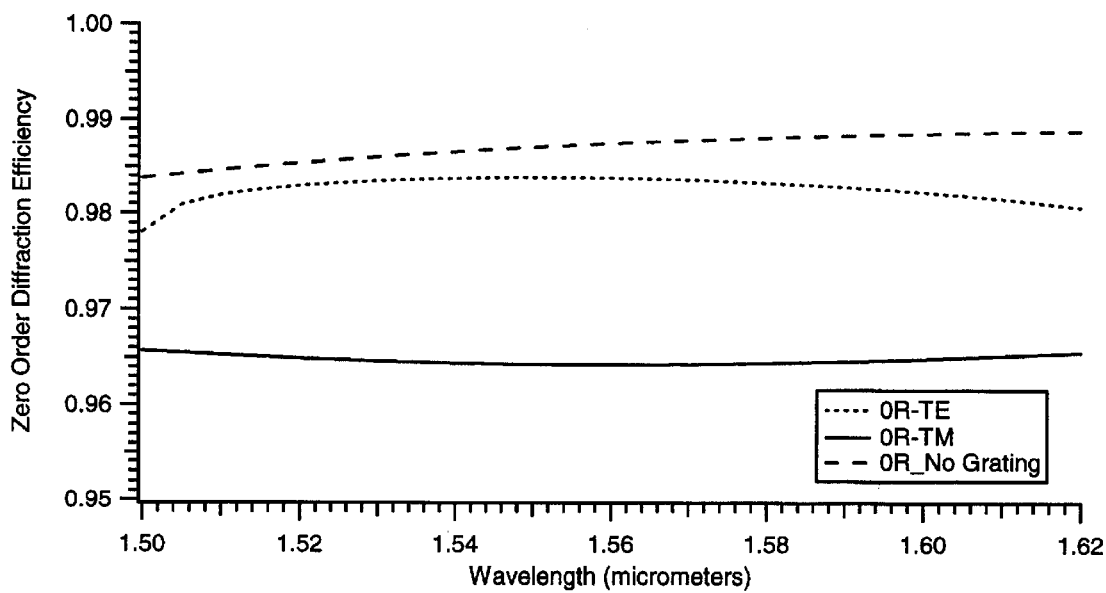
FIG. 23 is a graph schematically illustrating detail of calculated zero-order diffraction efficiency for TE and TM polarization as a function of wavelength in one example of the grating membrane mirror of FIG. 22 at wavelengths between about 1.50 and 1.62 $\mu$m.

FIGS. 22 and 23 are graphs schematically illustrating calculated zero-order diffraction efficiency for TE (dotted curve) and TM (solid curve) polarization as a function of wavelength in one example of grating membrane mirror 31E of FIG. 21 arranged to provide reflection of about 0.98 at wavelengths between about 1.53 and 1.565 $\mu$m and transmission greater than 0.70 for light having a wavelength of about 0.980 $\mu$m and at 20.0 degrees incidence. Grating 46 and layers 54 and 57 are assumed to be of polysilicon, and layers 52 and 55 are assumed to be layers of $SiO_2$. Uniform thickness portion 46A of grating 46 has a thickness of 0.094 $\mu$m. Grating strips 48 have a depth D of 0.220 $\mu$m. The grating period is 0.575 $\mu$m with a duty cycle of 0.5. Layer 52 has a physical thickness of 0.287 $\mu$m; layer 54 has a physical thickness of 0.146 $\mu$m; layer 55 has a physical thickness of 0.300 $\mu$m and layer 57 has a physical thickness of 0.116 $\mu$m.

Figure 24:
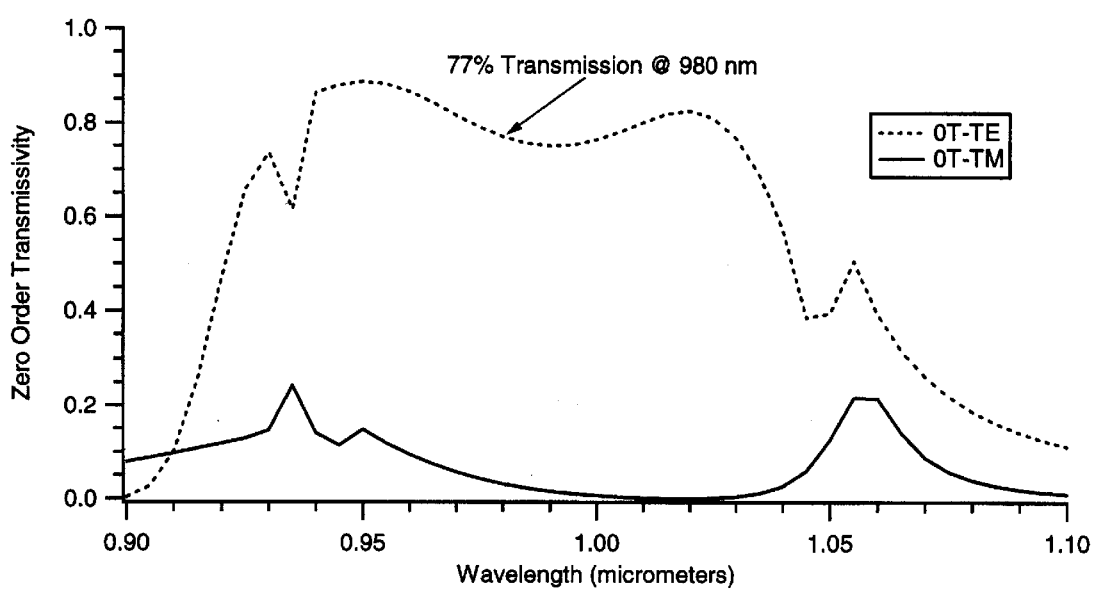
FIG. 24 is a graph schematically illustrating detail of calculated zero-order transmissivity at 20 degrees incidence for TE and TM polarization as a function of wavelength in one example of the grating membrane mirror of FIG. 22 at wavelengths between about 0.90 and 1.10 $\mu$m.

FIG. 24 is a graph schematically illustrating detail of zero-order transmissivity for TE ("P" polarized) and TM polarization at 20 degrees incidence as a function of wavelength at wavelengths between about 0.90 and 1.10 $\mu$m. There is a broad transmission region between wavelengths of about 0.94 and 1.06 $\mu$m for TE polarization only.

The following differences between grating membrane mirror 31E and above discussed embodiments 31A and 31B (wherein there is only a grating 46) should be noted. The grating depth is substantially less; the difference in diffraction efficiency at wavelengths between about 1.53 and 1.565 $\mu$m is substantially less; and the TE diffraction efficiency is higher than the TM diffraction efficiency at wavelengths between about 1.53 and 1.565 $\mu$m, which is the opposite in above discussed examples wherein there is only a grating 46. Referring in particular to FIG. 23, it can be seen that the zero-order diffraction efficiency for both TE and TM polarizations is less than the reflectivity (dashed curve) would be would be if grating strips 48 were removed from the grating. In mirror 31E, the grating reduces rather than enhances the reflectivity that would be provided by the uniform thickness layers and the uniform thickness portion of the grating alone.

One advantage of the above-discussed example of mirror 31E compared with embodiments including two or less uniform thickness layers is that the transmission at 0.980 $\mu$m occurs in a relatively broad transmission band. In other above discussed embodiments the transmission band including 0.98 $\mu$m is considerably narrower (compare FIGS. 24 and FIG. 17). In the narrower transmission region there can be considerable enhancement of intrinsic absorption in the layer materials. This could be a problem in applications where high pump power is required. Another advantage is that the grating depth is smaller compared with the total thickness of the mirror than in above discussed examples. This will provide that there is a lesser difference between the stiffness of the mirror parallel and perpendicular to the grating strips, resulting in lesser deformation of the membrane in flexure. Clearly, however, these advantages are achieved at the expense of a more complicated structure and a more costly manufacturing process.

A description of one preferred manufacturing process for mirror 31E is set forth below with reference to FIGS. 25A–K. The method involves a number of lithographic, layer deposition and etching steps. Each drawing depicts a stage in the fabrication process. Lithographic steps are not depicted in the drawings in order to minimize the number of drawings required for the description. Lithographic steps necessary to perform the various operations will be evident to those skilled in the art to which the present invention pertains.

In the preferred method, substrate 44 is formed from a 100-millimeter diameter <100> silicon wafer having a thickness of about 300 $\mu$m. Layers 80 and 82 of silicon dioxide are grown by plasma enhanced chemical vapor deposition (PECVD) on surfaces 44B and 44A respectively of substrate 44 (see FIG. 25A). Layer 80 preferably has a thickness of about 2.0 $\mu$m and layer 82 has a thickness of about 1.0 $\mu$m.

Figure 25A:
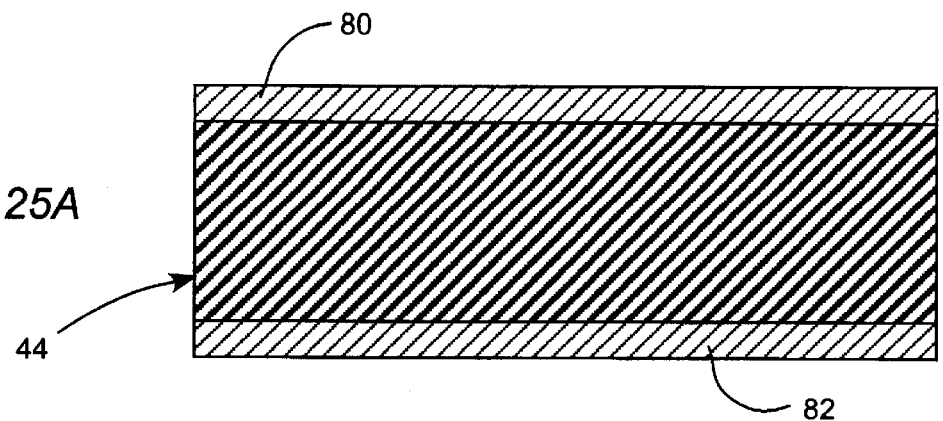
FIGS. 25A–K are cross-section views schematically illustrating steps in one preferred method of constructing the example of the grating membrane mirror of FIGS. 21–24.
Figure 25B:
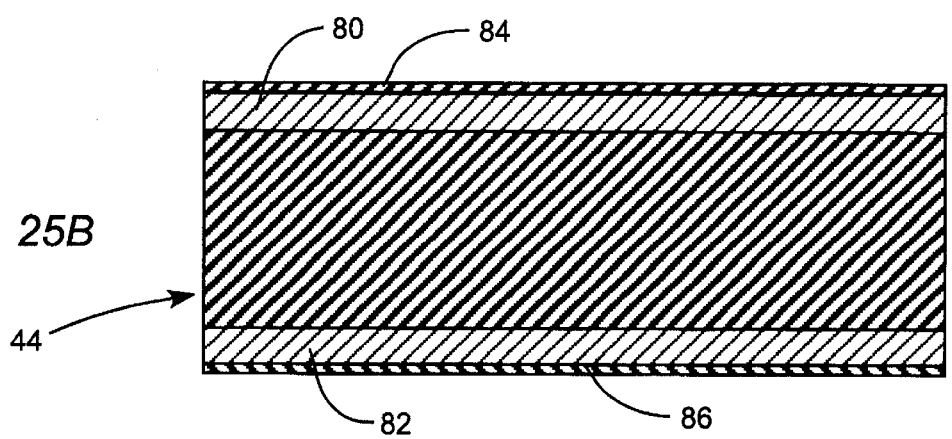
Figure 25C:
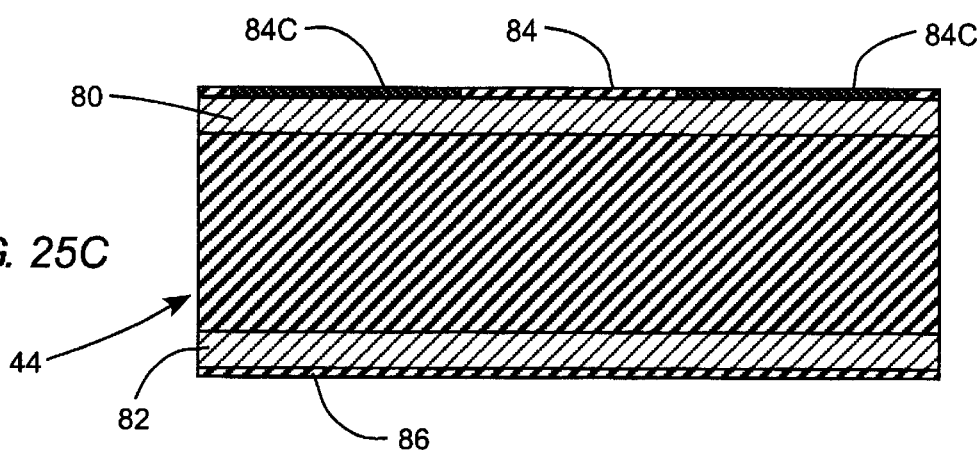

Next, layer 84 of silicon (polysilicon) having a thickness of about 0.116 $\mu$m is grown by a low-pressure CVD (LPCVD) on layer 80 (see FIG. 25B). A corresponding layer 86 is grown on layer 82. An ion implantation step is performed in these areas to provide electrically conductive areas 84C in layer 84 (see FIG. 25C).

Figure 25D:
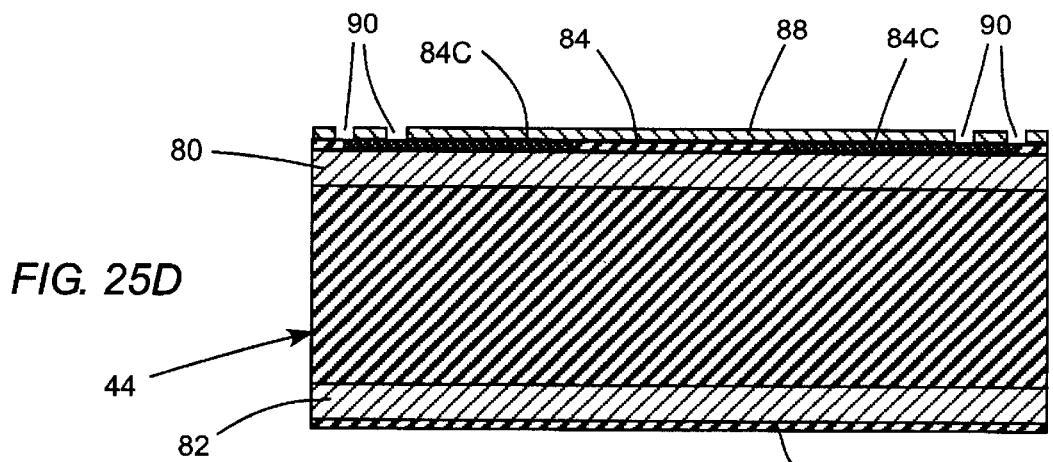

Following the ion implantation step, layer 88 of low stress silicon dioxide having a thickness of 0.300 $\mu$m is grown on layer 84 (see FIG. 25D). Annular apertures 90 are etched through the layer to conductive area 84C of underlying silicon layer 84.

Figure 25E:
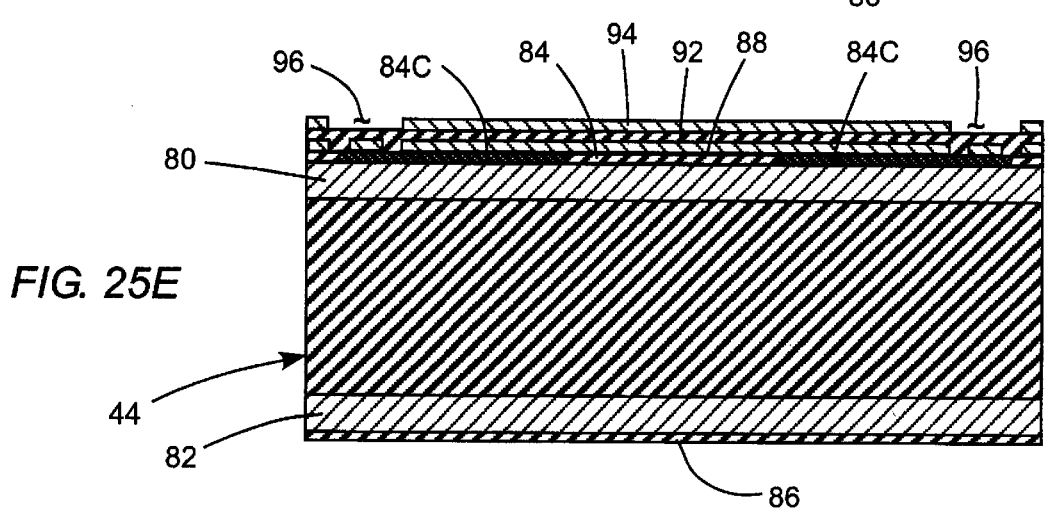
Figure 25F:
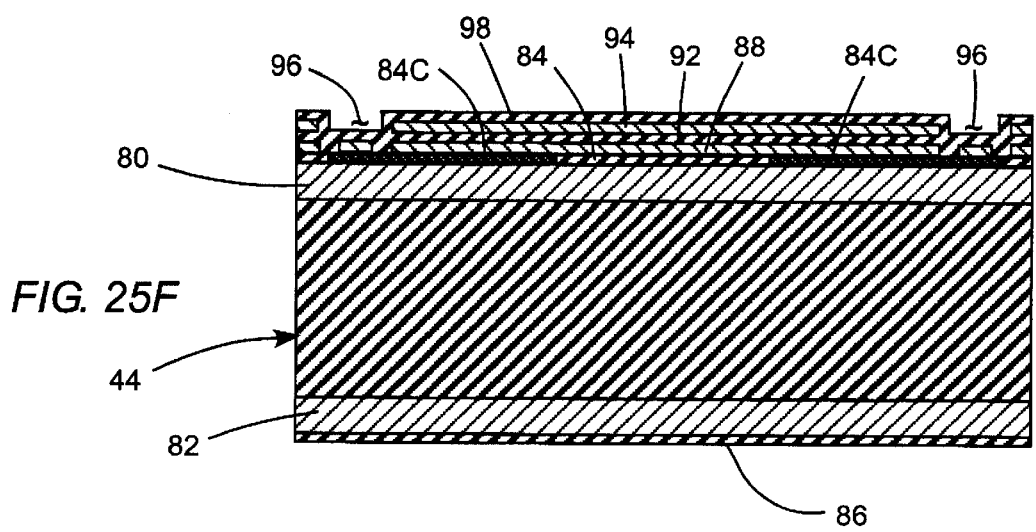

Referring now to FIG. 25E, a polysilicon layer 92 having a thickness of 0.146 $\mu$m is grown on layer 88. This layer fills apertures 90. Another layer 94 of low-stress silicon dioxide having a thickness of 0.287 $\mu$m is then grown on polysilicon layer 92 (see FIG. 25F). Circular apertures 96 are etched through this layer to the underlying polysilicon layer 92 above doughnut-shaped apertures 90.

Figure 25G:
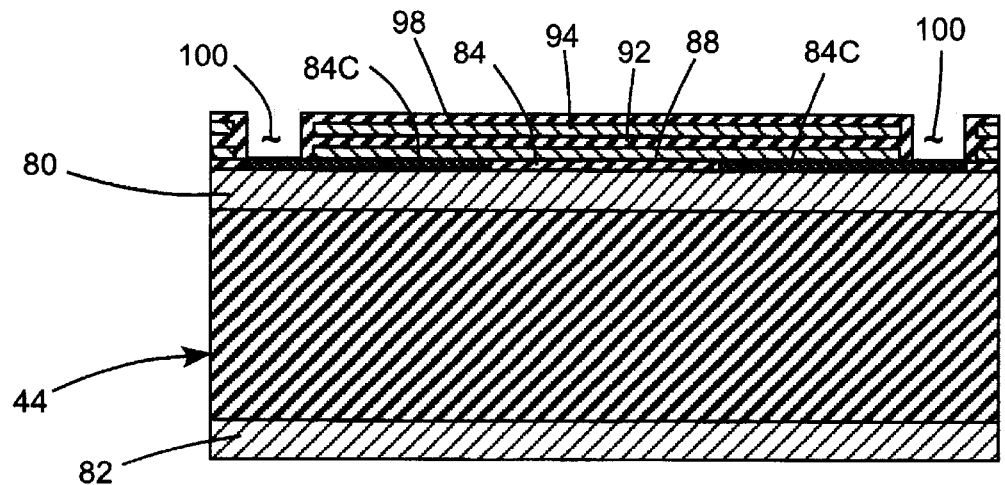
Figure 25H:
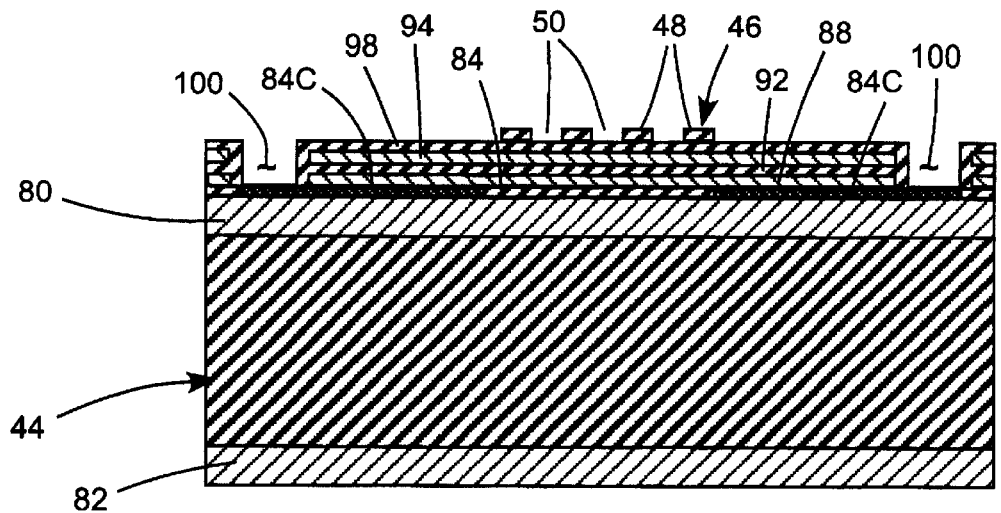

Next, a layer 98 of polysilicon having a thickness of about 0.094 $\mu$m is deposited on layer 94 by LPCVD (see FIG. 25G). Material of the layer partially fills apertures 96. Following deposition of layer 98, a dry-etching step is performed to provide silicon-lined apertures 100 extending through conductive portion 84C of layer 84 (see FIG. 25H). The dry-etching step also removes bottom layer 86.

Figure 25I:
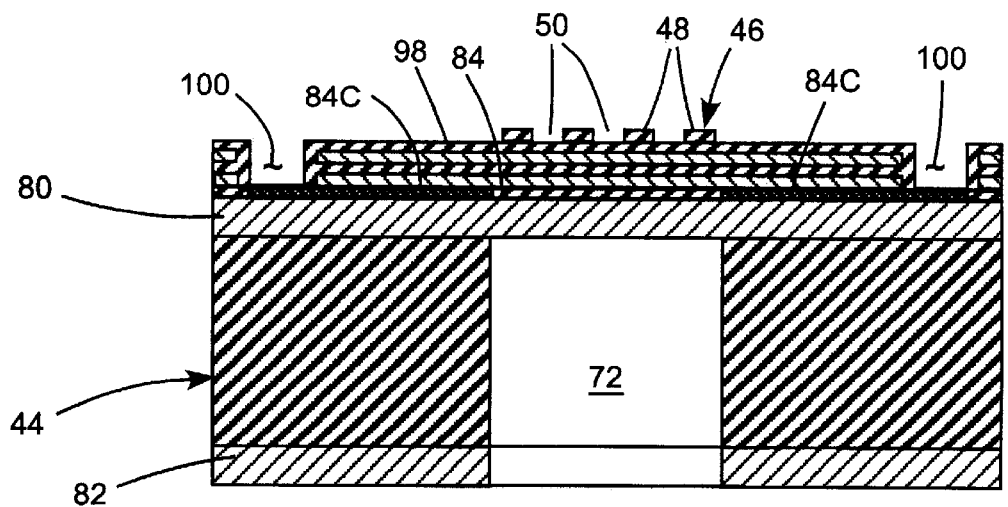

Referring to FIG. 25I grating strips 48 having a height of 0.220 $\mu$m and being separated by spaces 50 having are formed on layer 98. The grating period is 0.575 $\mu$m and the duty cycle is 0.50. In the finished mirror layer 98 provides uniform thickness portion 46A of the grating 46. It should be noted here that in alternative method of providing grating strips layer 98 could initially be made 0.317 μm thick and spaces 50 and strips 48 formed by reactive ion etching as discussed above.

Figure 25J:
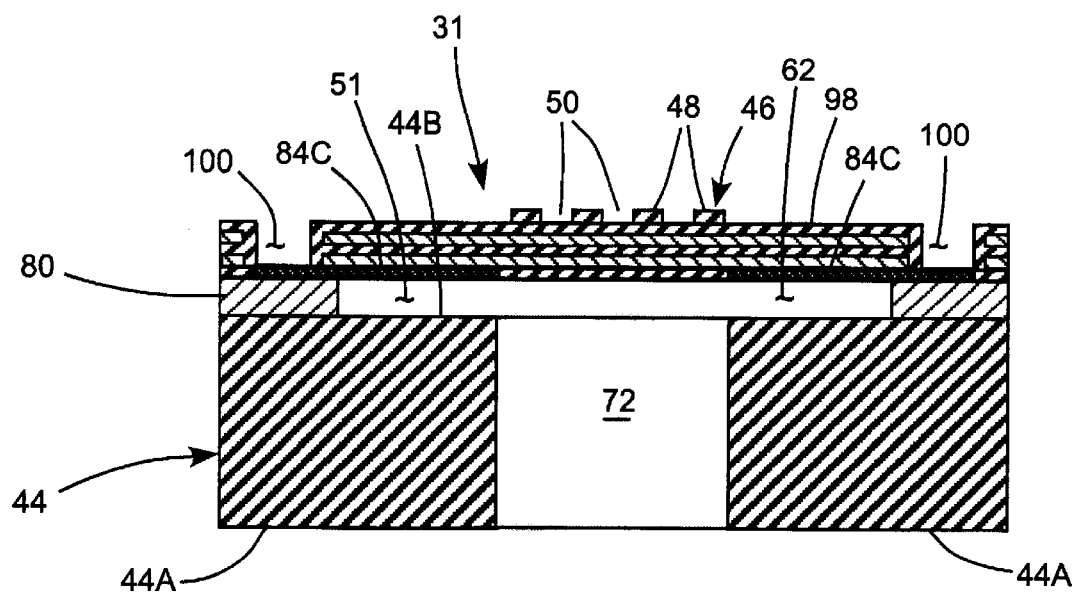
Figure 25K:
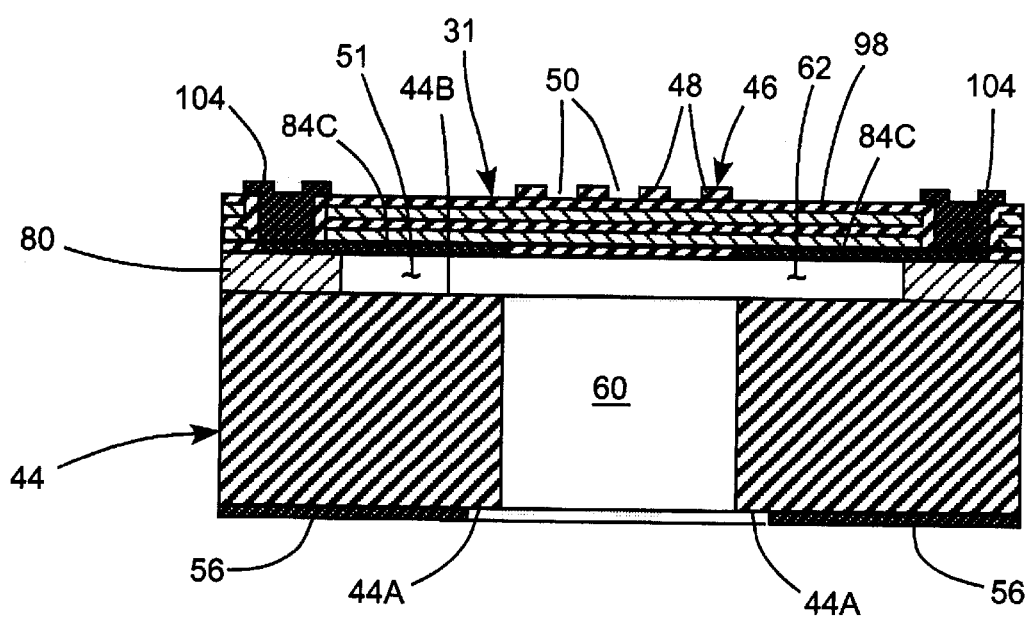

Referring next to FIG. 25J, undercut-etching to free a portion of mirror 31 from substrate 44 is performed. This begins with plasma etching aperture 72 (of FIG. 1) in oxide layer 82. Aperture 72 is then extended through substrate 44 by induction coupled plasma (ICP) etching. The ICP etching is terminated at oxide layer 80. Chemical etching is then performed to remove a sufficient portion of layer 80 to free a central portion of mirror 31 such that mirror becomes a membrane mirror supported at its periphery, via the remains of layer 80, on substrate 44. Removing the oxide layer defines the gap 62 (of FIG. 1) between mirror 44 and surface 44B of substrate 44. At this point, what remains of oxide layer 82 is also removed from substrate 44. Metallization is provided in apertures 100 and on surface 44A of substrate 44 (see FIG. 25K) to provide electrical contacts 104 and 46 respectively. Leads 58 and 60 of FIG. 1 are attached to contacts 104 and 46 respectively. It should be noted that layers 94, 92, 88, and 84 correspond to layers 52, 54, 55, and 57 of FIG. 24. Layer 98 corresponds to uniform 46A of grating 46 as noted above.

From the description of membrane steps provided above, one skilled in the art could readily determine steps necessary to fabricate a grating membrane mirror including fewer layers. A grating membrane mirror in accordance with the present invention having only a grating 46, could be fabricated using about eight less lithographic and layer deposition steps than are described above.

In the above-presented description of the present invention grating 46 is considered to be a square wave grating profile. This should not be construed as limiting the present invention. Grating 46 may have other profiles without departing from the spirit and scope of the present invention, including, for example a sinusoidal profile. In a sinusoidal profile depth D would be the peak to valley height of the sinusoid. Strip width would be measured at 50% of the peak-to-valley depth. The grating parameters could be determined using parametric contouring in the same manner as discussed above with reference to "square-wave" gratings.

The present invention is described above in terms of a preferred and other embodiments. The invention is not limited, however, to the embodiments described and depicted. Rather, the invention is limited only by the claims appended hereto.

What is claimed is:

1. A mirror for reflecting and transmitting light at respectively first and second different wavelengths, the second wavelength being shorter than the first wavelength, the mirror, comprising:

a membrane peripherally supported on a substrate over an aperture therein;

said membrane including a grating on a surface thereof, said grating including a regular array of spaced-apart parallel strips of a first material surmounting at least one optical interference layer of uniform thickness, said grating strips having a width and a height and said grating having a grating period defined as the distance between adjacent ones of said parallel strips, said grating period being less than the second wavelength, wherein the composition and thickness of said first material and said interference layer, the width and height of the grating and the ratio between said grating width and period, are selected such that:

a. first wavelength light that is normally incident on said mirror has different specular reflectivities in first and second polarization planes oriented respectively parallel and perpendicular to said grating strips; and b. the transmissivity of said mirror is greater than 50% for second-wavelength light in any one of said polarization orientations.

2. The mirror of claim 1, wherein said reflectivity difference is about 1% or greater.

3. The mirror of claim 1, wherein said specular reflectivity for said first wavelength is between about 90% and 99% in one of said polarization planes, and is at least about 1% less in the other of said polarization planes.

4. The mirror of claim 1, wherein said first-wavelength specular reflectivity is greatest in said polarization plane perpendicular to said grating strips.

5. The mirror of claim 1, wherein said first-wavelength specular reflectivity is greatest in said polarization plane parallel to said grating strips.

6. The mirror of claim 1, wherein said optical interference layer is a layer of said first material.

7. The mirror of claim 1, wherein said optical interference layer is a layer of a second material.

8. The mirror of claim 7, wherein said refractive index of the first material is greater than the refractive index of the second material.

9. The mirror of claim 7, wherein said refractive index of the first material is less than the refractive index of the second material.

10. The mirror of claim 1, wherein there are at least two of said optical interference layers and wherein said first-wavelength specular reflectivity in any of said polarization orientations is greater than would be provided by said at least two optical interference layers in the absence of said grating strips.

11. The mirror of claim 1, wherein there are at least four of said optical interference layers and wherein said first-wavelength specular reflectivity in any of said polarization orientations is less than would be provided by said at least four optical interference layers in the absence of said grating strips.

12. The mirror of claim 1, wherein a portion thereof is electrically conductive and is electrically isolated from said substrate, and wherein electrical contacts are provided on said mirror and said substrate for establishing an electrical potential therebetween such that a change in electrical potential causes the membrane to flex.

13. A mirror for reflecting and transmitting light at first and second different wavelengths, the second wavelength being shorter than the first wavelength, the mirror comprising:

a membrane of a material having a refractive index greater than about 1.6 said membrane being peripherally supported on a substrate over an aperture therein;

said membrane having first and second opposite surfaces, said first surface including a grating and said second surface being a plane surface, said grating including a regular array of parallel grooves defining spaced-apart parallel strips surmounting a uniform thickness portion of said membrane, said grating strips having a width and a height and said grating having a grating period defined as the distance between adjacent ones of said parallel strips, said grating period being less than the second wavelength, said membrane material, the width and height of the grating, the ratio between said grating width and period, and the thickness of said uniform thickness portion of said membrane being selected such that;

a. first wavelength light that is normally incident on the mirror has first and second specular reflectivities for normally incident light in first and second polarization planes oriented respectively perpendicular and parallel to said grating strips, said first specular reflectivity being between about 90% and 99% and said second specular reflectivity being at least about 1 percent less than said first specular reflectivity; and b. the mirror has greater than 50 percent transmissivity for the second-wavelength light in any one of said polarization plane orientations.

14. The mirror of claim 13, wherein the first wavelength is between about 1.515 and 1.565 micrometers and the second wavelength is one of 0.980 micrometers and 1.30 micrometers.

15. The mirror of claim 14, wherein said membrane material has a refractive index of about 3.5 at the first wavelength.

16. The mirror of claim 15, wherein said membrane material is polysilicon.

17. The mirror of claim 15, wherein said uniform-thickness portion has an optical thickness of about three half-wavelengths at the first wavelength.

18. The mirror of claim 13, wherein a portion thereof is electrically conductive and is electrically isolated from said substrate, and wherein electrical contacts are provided on said mirror and said substrate for establishing an electrical potential therebetween such that a change in electrical potential causes the membrane to flex.

19. A mirror for reflecting and transmitting light at first and second different wavelengths, the second wavelength being shorter than the first wavelength, the mirror comprising:

a membrane peripherally supported on a substrate over an aperture therein;

said membrane including a grating, said grating including a regular array of spaced-apart parallel strips of first material having a first refractive index surmounting a uniform thickness portion of said first material, said grating strips having a width and a height and said grating having a grating period defined as the distance between adjacent ones of said parallel strips, said grating period being less than the second wavelength;

said grating surmounting first, second, third and fourth uniform-thickness layers, numbered sequentially beginning with the layer adjacent said uniform thickness portion of said grating, said first and third layers being layers of a second material having a second refractive index different from said first refractive index, and said second and fourth layers being layers of said first material, wherein the composition of said materials forming the membrane and the first and second layers, the width and height of the grating, the ratio between said grating width and period, the thickness of said uniform thickness portion of said membrane and the thicknesses of said first, second, third, and fourth layers are selected such that:

a. first wavelength light that is normally incident on the mirror has first and second specular reflectivities in first and second polarization planes oriented respectively perpendicular and parallel to said grating strips, said second specular reflectivity being between about 90% and 99% and said first specular reflectivity being at least about 1 percent less than said first specular reflectivity; and b. the mirror has greater than 50 percent transmissivity for the second-wavelength light in any one of said polarization plane orientations.

20. The mirror of claim 19, wherein the first wavelength is between about 1.515 and 1.565 micrometers and the second wavelength is one of 0.980 micrometers and 1.30 micrometers.

21. The mirror of claim 20, wherein said first and second materials have refractive indices of about 3.5 and 1.42 respectively at the first wavelength.

22. The mirror of claim 20, wherein said first material is polysilicon and said second material is silicon dioxide.

23. The mirror of claim 20, wherein a portion thereof is electrically conductive and is electrically isolated from said substrate, and wherein electrical contacts are provided on said mirror and said substrate for establishing an electrical potential therebetween such that a change in electrical potential causes the membrane to flex.

24. A tunable laser, comprising:

a multilayer structure including a first mirror surmounted by a multilayer semiconductor gain-structure said gain-structure having a gain-bandwidth and being energized by pump light having a pump-light wavelength;

a second mirror in the form of a membrane peripherally supported on a semiconductor substrate having an aperture therein, said second mirror being spaced apart from said first mirror to form a laser resonator therebetween, said pump light being directed into said gain structure through said second mirror;

said laser resonator having a longitudinal axis and said gain-structure being included in said laser resonator, the optical spacing between said first and second mirrors being selected such that said laser resonant cavity supports only a single lasing mode having a wavelength within the gain-bandwidth of said gain-structure;

said second mirror including a grating on a surface thereof facing said gain structure, said grating including a regular array of spaced-apart parallel strips of a first material surmounting at least one optical interference layer of uniform thickness, said grating strips having a width and a height and said grating having a grating period defined as the distance between adjacent ones of said parallel strips, said grating period being less than said pump-light wavelength, wherein the composition and thickness of said first material and said interference layer, the width and height of the grating, and the ratio between said grating width and period are selected such that:

a. said second mirror has a sufficiently different reflectivity in polarization planes oriented parallel and perpendicular to said grating strips, for light having the lasing mode wavelength, that said lasing mode is plane polarized in the plane for which said reflectivity is highest, and b. said second mirror has a transmissivity greater than about 0.50 at said pump-light wavelength in any polarization plane orientation; and wherein a portion of said second mirror is electrically conductive and is electrically isolated from said substrate, and wherein electrical contacts are provided on said mirror and said substrate for establishing an electrical potential therebetween such that said electrical potential determines the spacing between said first and second mirrors, thereby determining said lasing mode wavelength.

25. The laser of claim 24, wherein said lasing wavelength is between about 1.515 and 1.565 micrometers and said pump-light wavelength is about 0.980 micrometers.

26. The laser of claim 24, wherein said grating surmounts only one optical interference layer, said layer being a layer of said first material.

27. The laser of claim 26, wherein said first refractive index is about 3.5 at said lasing mode wavelength.

28. The laser of claim 27, wherein said first material is polysilicon.

29. The laser of claim 27, wherein said reflectivity is highest in said perpendicular-oriented polarization plane.

30. The laser of claim 24, wherein said optical interference layer is a layer of a second material.

31. The laser of claim 25, wherein said grating strips surmount first, second, third, fourth and fifth optical interference layers, numbered sequentially beginning with the layer adjacent said grating strips, said first, third, and fifth layers being layers of said first material, said second and fourth layers being layers said second material and said second refractive index being less than said first refractive index.

32. The laser of claim 31, wherein said first and second refractive indices are about 3.5 and about 1.42 respectively at said lasing mode wavelength.

33. The laser of claim 32, wherein said reflectivity is highest in said parallel-oriented polarization plane.

* * * * *